(12) United States Patent
Jo et al.

(10) Patent No.: US 12,495,693 B2
(45) Date of Patent: Dec. 9, 2025

(54) TRANSPARENT DISPLAY APPARATUS

(71) Applicant: LG Display Co., Ltd., Seoul (KR)

(72) Inventors: SungHak Jo, Paju-si (KR); Sunyoung Park, Paju-si (KR); Binn Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 622 days.

(21) Appl. No.: 17/985,722

(22) Filed: Nov. 11, 2022

(65) Prior Publication Data

US 2023/0209953 A1 Jun. 29, 2023

(30) Foreign Application Priority Data

Dec. 28, 2021 (KR) ........................ 10-2021-0189818

(51) Int. Cl.
*H10K 59/131* (2023.01)
*H10K 59/35* (2023.01)
*H10K 59/88* (2023.01)

(52) U.S. Cl.
CPC ......... *H10K 59/353* (2023.02); *H10K 59/131* (2023.02); *H10K 59/351* (2023.02); *H10K 59/352* (2023.02); *H10K 59/88* (2023.02)

(58) Field of Classification Search
CPC .... H10K 59/353; H10K 59/131; H10K 59/88; H10K 59/351; H10K 59/352
USPC .................................................. 313/498–512
See application file for complete search history.

(56) References Cited

U.S. PATENT DOCUMENTS

| | | | |
|---|---|---|---|
| 8,558,222 | B2 | 10/2013 | Hwang et al. |
| 8,952,374 | B2 | 2/2015 | Jinta et al. |
| 9,660,001 | B2 | 5/2017 | Kim |
| 2013/0162616 | A1 | 6/2013 | Park et al. |
| 2015/0054719 | A1 | 2/2015 | Lee et al. |
| 2016/0027850 | A1* | 1/2016 | Lv .................. H10K 59/121 257/40 |

(Continued)

FOREIGN PATENT DOCUMENTS

| | | |
|---|---|---|
| JP | 2011129510 A | 6/2011 |
| JP | 2012209504 A | 10/2012 |

(Continued)

*Primary Examiner* — Christopher M Raabe
(74) *Attorney, Agent, or Firm* — Seed Intellectual Property Law Group LLP

(57) ABSTRACT

A transparent display apparatus is provided, in which light efficiency and/or transmittance is improved. The transparent display apparatus comprises a substrate provided with a plurality of pixels having a transmissive portion and a plurality of light emitting portions emitting light of different colors, and a non-transmissive portion provided between the transmissive portion and the plurality of light emitting portions and between the plurality of light emitting portions on the substrate, wherein each of the plurality of light emitting portions includes a first sub-light emitting portion and a second sub-light emitting portion, which have the same shape and size and are spaced apart from each other, the non-transmissive portion includes a first non-transmissive portion adjacent to a short side disposed in a first direction in each of the first sub-light emitting portion and the second sub-light emitting portion and a second non-transmissive portion adjacent to a long side disposed in a second direction crossing the first direction.

30 Claims, 10 Drawing Sheets

(56) References Cited

U.S. PATENT DOCUMENTS

| | | | |
|---|---|---|---|
| 2016/0120005 A1* | 4/2016 | Wu | H05B 33/22 |
| | | | 313/505 |
| 2017/0271415 A1 | 9/2017 | Yamazaki | |
| 2018/0175120 A1 | 6/2018 | Hsin et al. | |
| 2019/0206955 A1 | 7/2019 | Paek et al. | |
| 2020/0066817 A1 | 2/2020 | Kim | |
| 2020/0106049 A1 | 4/2020 | Lee et al. | |
| 2020/0212131 A1 | 7/2020 | Kim et al. | |
| 2021/0202641 A1 | 7/2021 | Shin et al. | |
| 2021/0225958 A1 | 7/2021 | Ko et al. | |
| 2021/0351237 A1* | 11/2021 | Tsai | H10K 59/352 |
| 2021/0399081 A1 | 12/2021 | Park et al. | |

FOREIGN PATENT DOCUMENTS

| | | |
|---|---|---|
| JP | 2014186258 A | 10/2014 |
| KR | 20150050318 A | 5/2015 |
| KR | 101844174 B1 | 3/2018 |
| KR | 20190054563 A | 5/2019 |
| KR | 20200023072 A | 3/2020 |

\* cited by examiner

ⓐ

ⓑ

ⓒ

ⓓ

TRANSPARENT DISPLAY APPARATUS

CROSS-REFERENCE TO RELATED APPLICATIONS

This application claims the benefit of the Korean Patent Application No. 10-2021-0189818 filed on Dec. 28, 2021, which is hereby incorporated by reference as if fully set forth herein.

BACKGROUND

Technical Field

The present disclosure relates to a transparent display apparatus.

Description of the Related Art

With the advancement of the information age, the demand for a display apparatus for displaying an image has increased in various forms. Therefore, various types of display apparatuses such as a liquid crystal display (LCD) apparatus, a plasma display panel (PDP) apparatus, an organic light emitting display (OLED) apparatus and a quantum dot light emitting display (QLED) apparatus have been recently used.

Recently, studies for a transparent display apparatus in which a user may view objects or images positioned at an opposite side by transmitting the display apparatus are actively ongoing.

The transparent display apparatus may include a display area, on which an image is displayed, in a substrate, and the display area may include a transmissive area capable of transmitting external light and a non-transmissive area that does not transmit light. The non-transmissive area may include a light emission area in which light is emitted, and a non-light emission area provided between the transmissive area and the light emission area.

Sizes of the light emission area and the transmissive area in the substrate having a limited size have a trade-off relation. Therefore, when the size of the light emission area is increased, the size of the transmissive portion is reduced, and when the size of the transmissive portion is increased, the size of the light emission area is reduced. That is, when light efficiency is increased, transmittance is lowered, and when transmittance is increased, light efficiency is lowered.

BRIEF SUMMARY

The present disclosure provides a transparent display apparatus in which light efficiency and/or transmittance is improved.

In addition to the technical benefits of the present disclosure as mentioned above, additional technical benefits and features of the present disclosure will be clearly understood by those skilled in the art from the description herein of the present disclosure.

In accordance with an aspect of the present disclosure, the above and other technical benefits can be accomplished by the provision of a transparent display apparatus comprising a substrate provided with a plurality of pixels having a transmissive portion and a plurality of light emitting portions emitting light of different colors, and a non-transmissive portion provided between the transmissive portion and the plurality of light emitting portions and between the plurality of light emitting portions on the substrate, wherein each of the plurality of light emitting portions includes a first sub-light emitting portion and a second sub-light emitting portion, which have the same shape and size and are spaced apart from each other, the non-transmissive portion includes a first non-transmissive portion adjacent to a short side disposed in a first direction in each of the first sub-light emitting portion and the second sub-light emitting portion and a second non-transmissive portion adjacent to a long side disposed in a second direction crossing the first direction, the short sides of the first sub-light emitting portion and the second sub-light emitting portion include a first short side connected to one side of the long side and a second short side connected to the other side of the long side, the long side of the first sub-light emitting portion includes a first long side connecting one side of the first short side of the first sub-light emitting portion with one side of the second short side of the first sub-light emitting portion and a second long side connecting the other side of the first short side of the first sub-light emitting portion with the other side of the second short side of the first sub-light emitting portion, the long side of the second sub-light emitting portion includes a first long side connecting one side of the first short side of the second sub-light emitting portion with one side of the second short side of the second sub-light emitting portion and a second long side connecting the other side of the first short side of the second sub-light emitting portion and the other side of the second short side of the second sub-light emitting portion, the first non-transmissive portion and the second non-transmissive portion are provided to satisfy $A:2B=(a+b):(c+d+e)$, where 'A' is a length of the long side of the first sub-light emitting portion, 'B' is a length of the short side of the first sub-light emitting portion, 'a' is a length of the first non-transmissive portion in the second direction, which is adjacent to the first short side of the first sub-light emitting portion, 'b' is a length of the first non-transmissive portion in the second direction, which is adjacent to the second short side of the first sub-light emitting portion, 'c' is a length of the second non-transmissive portion in the first direction, which is adjacent to the first long side of the first sub-light emitting portion, 'd' is a length of the second non-transmissive portion in the first direction, which is adjacent to the second long side of the first sub-light emitting portion or the first long side of the second sub-light emitting portion, and 'e' is a length of the second non-transmissive portion in the first direction, which is adjacent to the second long side of the second sub-light emitting portion.

In accordance with an aspect of the present disclosure, the above and other objects can be accomplished by the provision of a transparent display apparatus comprising a substrate provided with a plurality of pixels having a transmissive portion and a plurality of light emitting portions, and a non-transmissive portion provided between the transmissive portion and the plurality of light emitting portions and between the plurality of light emitting portions on the substrate, wherein each of the light emitting portions includes a plurality of first light emitting sides disposed in parallel and a plurality of second light emitting sides respectively connected to the first light emitting sides, the non-transmissive portion includes a plurality of first non-transmissive portions respectively adjacent to the first light emitting sides and a plurality of second non-transmissive portions respectively adjacent to the second light emitting sides, and a ratio of a length of each of the first light emitting sides to each of the second light emitting sides is equal to a ratio of a sum length of the second non-transmissive portions to a sum length of the first non-transmissive portions.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
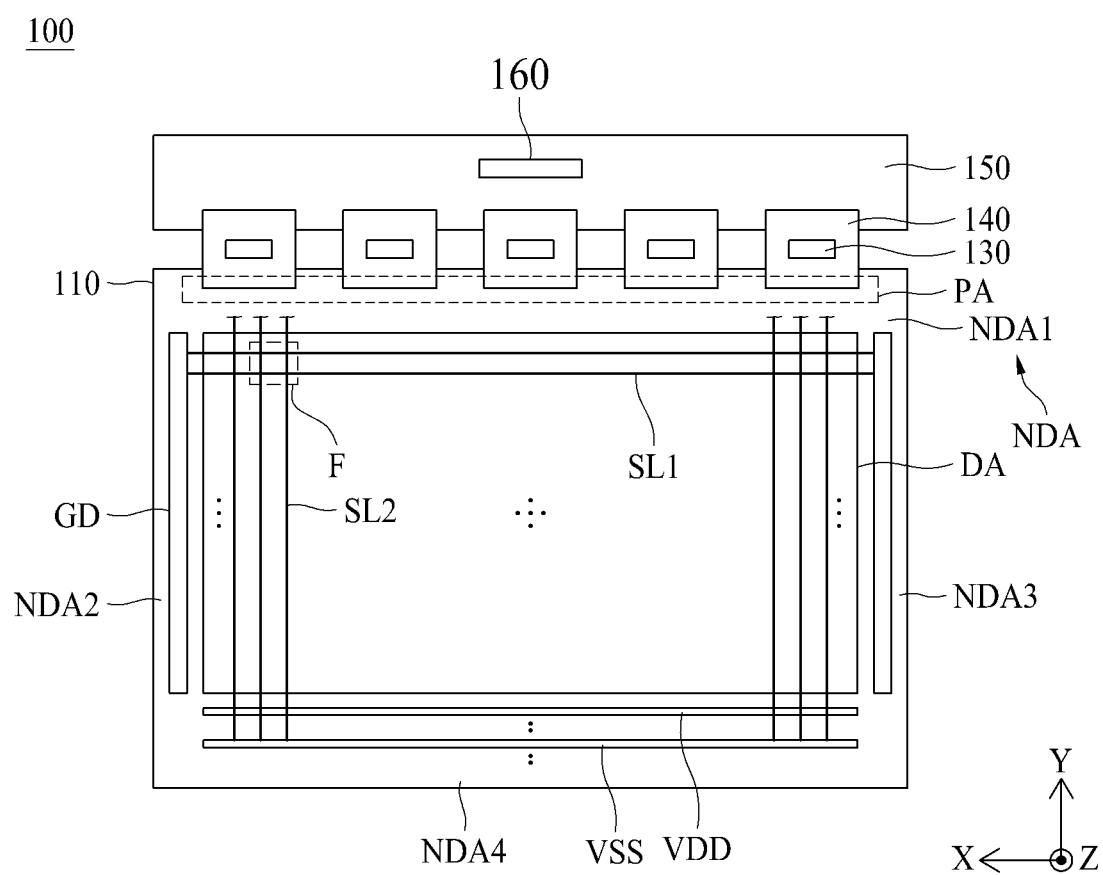
FIG. 1 is a plan view illustrating a transparent display apparatus according to one embodiment of the present disclosure.

Reference will now be made in detail to the embodiments of the present disclosure, examples of which are illustrated in the accompanying drawings.

Wherever possible, the same reference numbers will be used throughout the drawings to refer to the same or like parts.

Advantages and features of the present disclosure, and implementation methods thereof will be clarified through following embodiments described with reference to the accompanying drawings.

The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details.

Like reference numerals refer to like elements throughout. In the description herein, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms.

These terms are only used to distinguish one element from another. For example, a first element could be termed a second element, and, similarly, a second element could be termed a first element, without departing from the scope of the present disclosure.

"X-axis direction", "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand.

The embodiments of the present disclosure may be carried out independently from each other or may be carried out together in co-dependent relationship.

Hereinafter, the preferred embodiments of the present disclosure will be described in detail with reference to the accompanying drawings.

Figure 2:
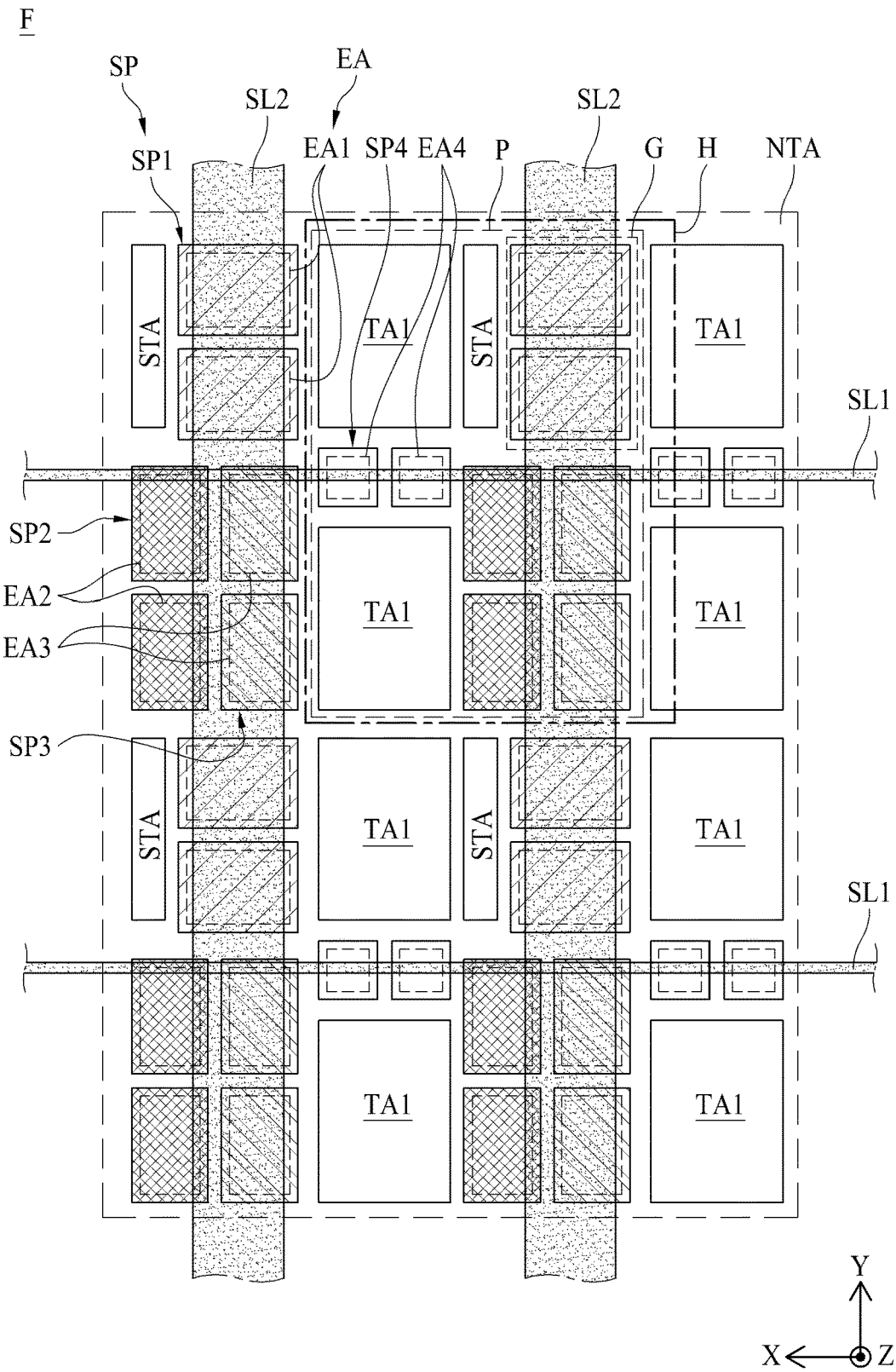
FIG. 2 is a schematic enlarged view illustrating a portion F of FIG. 1.
Figure 3:
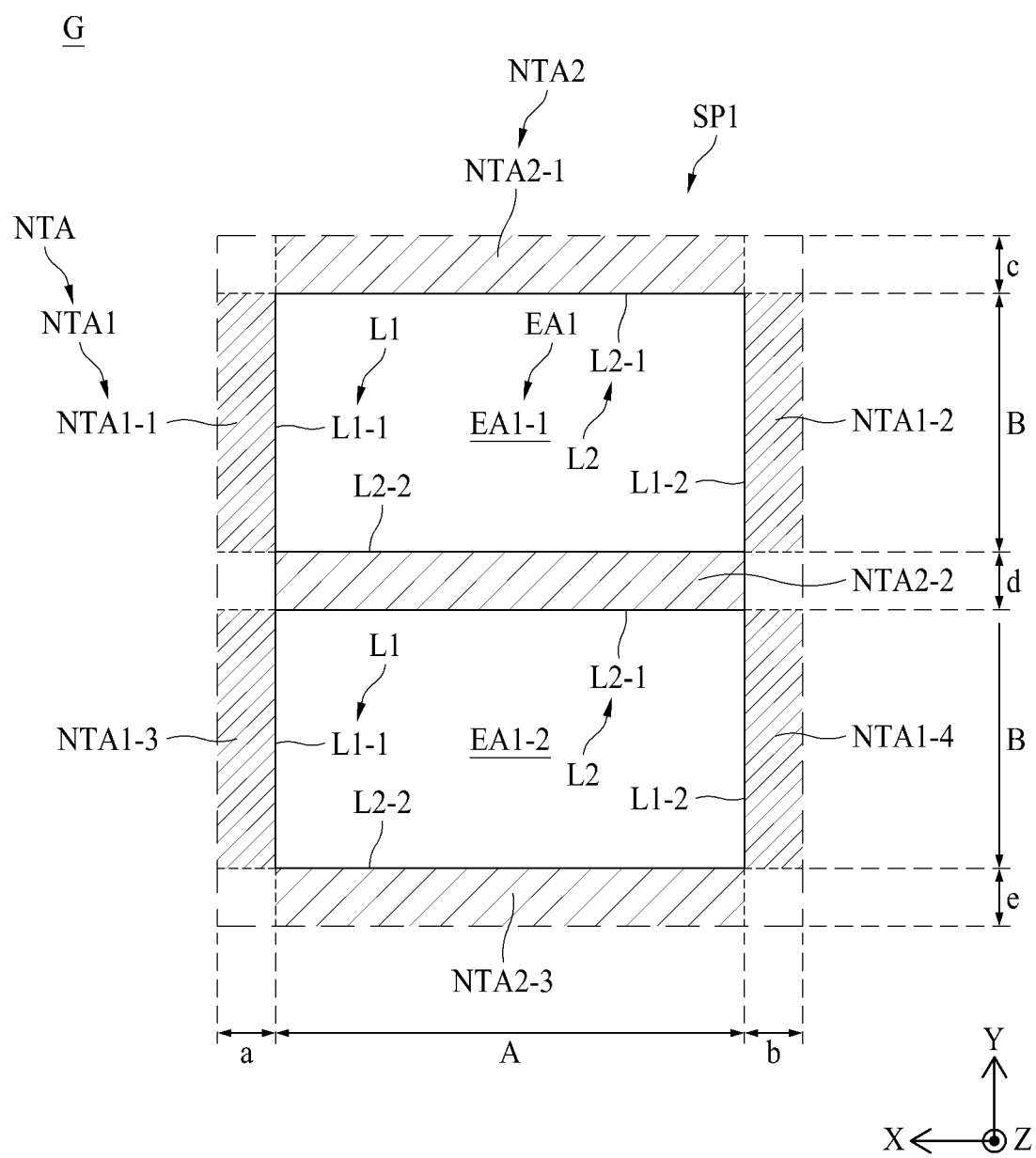
FIG. 3 is a schematic enlarged view illustrating a portion G of FIG. 2.
Figure 4:
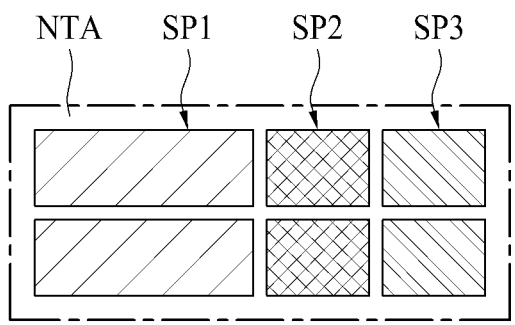
FIG. 4 is a view illustrating various examples of arrangement of a colored light emitting portion for minimizing a size of a non-transmissive portion.
Figure 4:
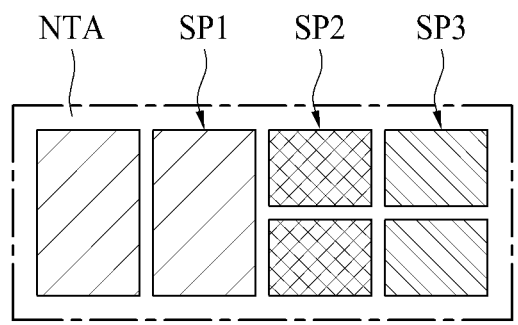
Figure 4:
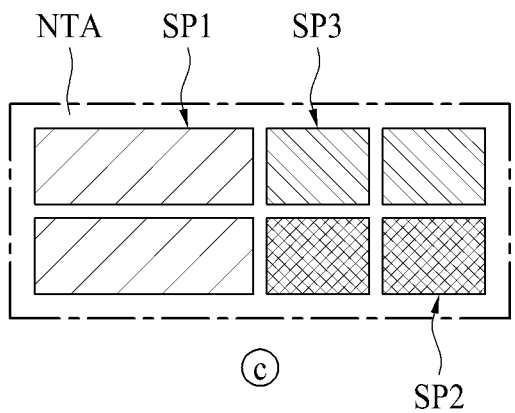
Figure 4:
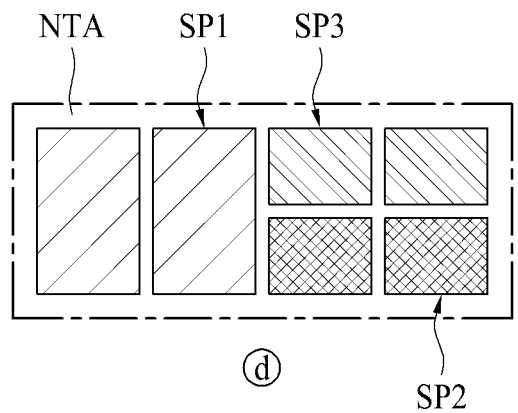
Figure 5:
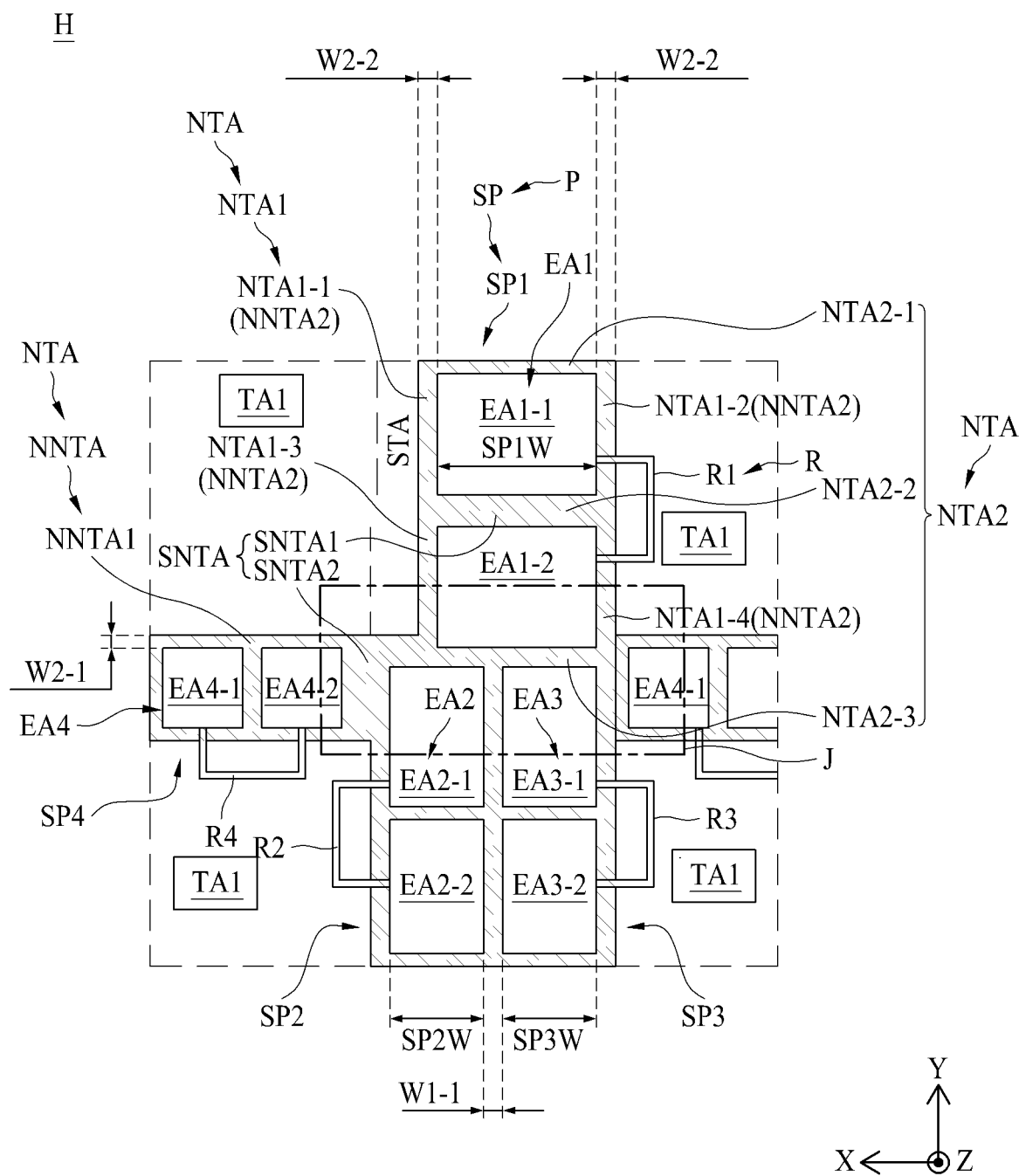
FIG. 5 is a schematic enlarged view illustrating a portion H of FIG. 2.
Figure 6:
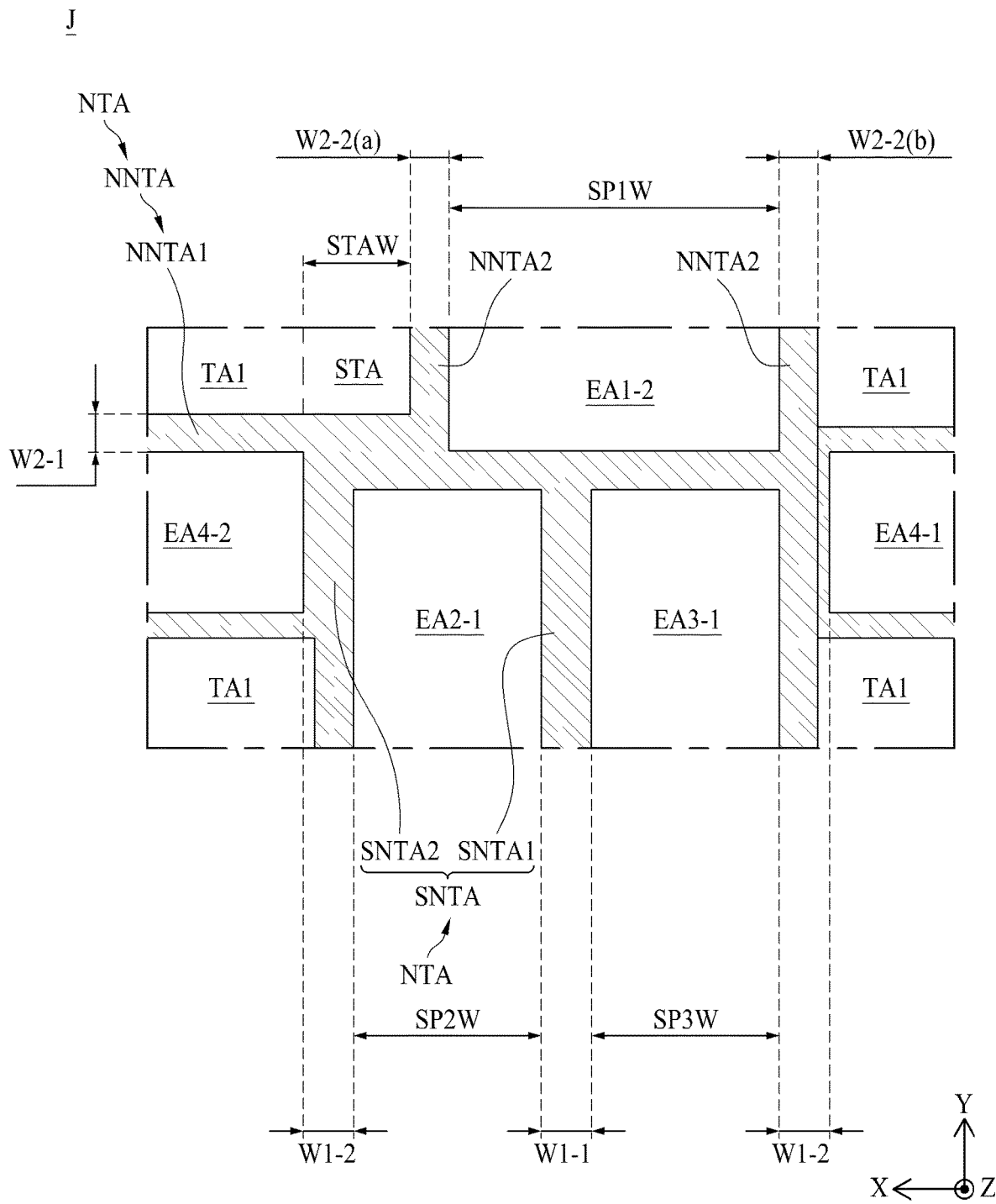
FIG. 6 is a schematic enlarged view illustrating a portion J of FIG. 5.

FIG. 1 is a plan view illustrating a transparent display apparatus according to one embodiment of the present disclosure, FIG. 2 is a schematic enlarged view illustrating a portion F of FIG. 1, FIG. 3 is a schematic enlarged view illustrating a portion G of FIG. 2, FIG. 4 is a view illustrating various examples of arrangement of a colored light emitting portion for minimizing a size of a non-transmissive portion, FIG. 5 is a schematic enlarged view illustrating a portion H of FIG. 2, and FIG. 6 is a schematic enlarged view illustrating a portion J of FIG. 5.

Hereinafter, X-axis represents a direction parallel with a gate line, Y-axis represents a direction parallel with a data line, and Z-axis represents a thickness direction of a transparent display apparatus 100.

The description herein will be based on that a transparent display apparatus 100 according to one embodiment of the present disclosure is an organic light emitting display apparatus, but is not limited thereto. The transparent display apparatus according to one embodiment of the present disclosure may be implemented as any one of a liquid crystal display apparatus, a field emission display apparatus, a quantum dot lighting emitting diode apparatus, and an electrophoretic display apparatus as well as the organic light emitting display apparatus.

Referring to FIGS. 1 to 6, the display apparatus 100 according to one embodiment of the present disclosure may include a display panel having a gate driver GD, a source drive integrated circuit (hereinafter, referred to as "IC") 130, a flexible film 140, a circuit board 150, and a timing controller 160.

The display panel may include a substrate 110 and an opposite substrate 120 (shown in FIG. 7), which are bonded to each other.

The substrate 110 may include a thin film transistor, and may be a transistor array substrate, a lower substrate, a base substrate, or a first substrate. The substrate 110 may be a transparent glass substrate or a transparent plastic substrate. Hereinafter, the substrate 110 will be defined as a first substrate.

The opposite substrate 120 may be bonded to the first substrate 110 via an adhesive member. For example, the opposite substrate 120 may have a size smaller than that of the first substrate 110, and may be bonded to the remaining portion except the pad area of the first substrate 110. The opposite substrate 120 may be an upper substrate, a second substrate, or an encapsulation substrate. Hereinafter, the opposite substrate 120 will be defined as a second substrate.

The gate driver GD supplies gate signals to the gate lines in accordance with the gate control signal input from the timing controller 160. When the source drive IC 130 is manufactured as a driving chip, the source drive IC 130 may be packaged in the flexible film 140 in a chip on film (COF) method or a chip on plastic (COP) method.

Pads such as power pads and data pads may be formed in a non-display area of a display panel. A flexible film 140 may include lines connecting the pads to a source drive IC 130 and lines connecting the pads to lines of a circuit board 150. The flexible film 140 may be attached to the pads by using an anisotropic conducting film, whereby the pads may be connected to the lines of the flexible film 140.

Referring to FIG. 1, the first substrate 110 according to an example may include a display area DA and a non-display area NDA.

The display area DA is an area where an image is displayed, and may be a pixel array area, an active area, a pixel array unit, a display unit, or a screen. For example, the display area DA may be disposed at a central portion of the display panel.

The display area DA according to an example may include gate lines, data lines, pixel driving power lines, and a plurality of pixels P (shown in FIG. 2). Each of the plurality of pixels P may include a plurality of light emitting portions SP that may be defined by the gate lines and the data lines, and a transmissive portion TA1 disposed to be adjacent to some or all of the plurality of light emitting portions SP. The transmissive portion TA1 is an area provided to allow light to transmit front and rear surfaces of the display panel. Therefore, a user located in the direction of the front surface of the display panel may view an image or background positioned in the direction of the rear surface of the display panel through the transmissive portion TA1.

Each of the plurality of light emitting portions SP may be defined as a minimum unit area in which light is actually emitted.

According to one example, at least four light emitting portions, which are provided to emit light of different colors and disposed to be adjacent to one another, among the plurality of light emitting portions SP, and one transmissive portion TA1 constitute one unit pixel P. One transmissive portion TA1 included in the unit pixel may be disposed to be divided into a plurality of areas. One unit pixel may include, but is not limited to, a red light emitting portion, a green light emitting portion, a blue light emitting portion, a white light emitting portion and a transmissive portion TA1. According to an example, three light emitting portions SP, which are provided to emit light of different colors and disposed to be adjacent to one another, among the plurality of light emitting portions SP, and one transmissive portion TA1 constitute one unit pixel. One unit pixel may include at least one red light emitting portion, at least one green light emitting portion, at least one blue light emitting portion and one transmissive portion TA1, but is not limited thereto.

Each of the plurality of light emitting portions SP may include a thin film transistor and a light emitting element connected to the thin film transistor. The light emitting portion may include a light emitting layer (or an organic light emitting layer) interposed between a first electrode and a second electrode.

The light emitting layer disposed in each of the plurality of light emitting portions SP may individually emit light of different colors, or may commonly emit white light. According to one example, when the light emitting layer of each of the plurality of light emitting portions SP commonly emits white light, each of the red light emitting portion, the green light emitting portion and the blue light emitting portion may include a color filter (or a wavelength conversion member) for converting the white light into light of different colors. In this case, the white light emitting portion according to one example may not include a color filter. In the transparent display apparatus 100 according to one embodiment of the present disclosure, an area in which a red color filter is provided may be a red light emitting portion SP1, an area in which a green color filter is provided may be a green light emitting portion SP2, an area in which a blue color filter is provided may be a blue light emitting portion SP3, and an area in which a color filter is not provided may be a white light emitting portion SP4. In the present disclosure, the red light emitting portion SP1 may be expressed as a first light emitting portion provided to emit red light, the green light emitting portion SP2 may be expressed as a second light emitting portion provided to emit green light, the blue light emitting portion SP3 may be expressed as a third light emitting portion configured to emit blue light and the white light emitting portion SP4 may be represented as a fourth light emitting portion provided to emit white light.

Each of the plurality of light emitting portions SP supplies a predetermined current to the organic light emitting element in accordance with a data voltage of the data line when a gate signal is input from the gate line by using the thin film transistor. For this reason, the light emitting layer of each of the light emitting portions may emit light with a predetermined brightness in accordance with the predetermined current.

Each of the plurality of light emitting portions SP emitting light of different colors may include two sub-light emitting portions, for example, a first sub-light emitting portion and a second sub-light emitting portion, which have the same shape and size and are spaced apart from each other as shown in FIG. 2. A structure of each of the light emitting portions SP will be described later with reference to FIG. 7.

As shown in FIG. 2, the display area DA includes a transmissive portion TA1 and a non-transmissive portion NTA. The transmissive portion TA1 is an area through which most of light incident from the outside passes, and the non-transmissive portion NTA is an area that does not transmit most of light incident from the outside.

The non-transmissive portion NTA may be provided with a plurality of pixels P, and a plurality of first and second signal lines SL1 and SL2 for supplying signals to the plurality of pixels P, respectively.

The plurality of first signal lines SL1 may be extended in the second direction (e.g., X-axis direction). Each of the plurality of first signal lines SL1 may include at least one scan line.

Hereinafter, when the first signal line SL1 includes a plurality of lines, one first signal line SL1 may refer to a signal line group comprised of a plurality of lines. For example, when the first signal line SL1 includes two scan lines, one first signal line SL1 may refer to a signal line group comprised of two scan lines.

The plurality of second signal lines SL2 may be extended in the first direction (e.g., Y-axis direction). The plurality of second signal lines SL2 may cross the plurality of first signal lines SL1. Each of the plurality of second signal lines SL2 may include a pixel power line VDDL and a common power line VSSL. In one embodiment, each of the plurality of second signal lines SL2 may further include a first data line DL1, a reference line REFL, a second data line DL2, a third data line DL3 and a fourth data line DL4.

Hereinafter, when the second signal line SL2 includes a plurality of lines, one second signal line SL2 may refer to a signal line group comprised of a plurality of lines. For example, when the second signal line SL2 includes four data lines, a pixel power line, a common power line and a reference line, one second signal line SL2 may refer to a signal line group comprised of four data lines, a pixel power line, a common power line and a reference line.

At least one transmissive portion TA1 may be disposed between the first signal lines SL1 adjacent to each other. In addition, at least one transmissive portion TA1 may be disposed between the second signal lines SL2 adjacent to each other. The transmissive portion TA1 may be surrounded by two first signal lines SL1 and two second signal lines SL2.

The non-display area NDA is an area on which an image is not displayed, and may be a peripheral circuit area, a signal supply area, an inactive area or a bezel area. The non-display area NDA may be configured to be in the vicinity of the display area DA. The non-display area NDA may be disposed to surround the display area DA.

In the transparent display apparatus 100 according to one embodiment of the present disclosure, a pad area PA may be disposed in the non-display area NDA. The pad area PA may supply a power source and/or a signal for outputting an image to the pixel P provided in the display area DA. The non-display area NDA may include a first non-display area NDA1, a second non-display area NDA2, a third non-display area NDA3 and a fourth non-display area NDA4. The area in which the pad area PA is provided may be the first non-display area NDA1.

The gate driver GD supplies gate signals to the gate lines in accordance with the gate control signal input from the timing controller 160. The gate driver GD may be formed on one side of the display area DA of the display panel or on the non-display area NDA outside both sides of the display area DA in a gate driver in panel (GIP) method as shown in FIG. 1. Alternatively, the gate driver GD may be manufactured as a driving chip, packaged in a flexible film and attached to the non-display area NDA outside one side or both sides of the display area DA of the display panel by a tape automated bonding (TAB) method.

The plurality of gate drivers GD may be separately disposed on a left side of the display area DA, e.g., the second non-display area NDA2 and a right side of the display area DA, e.g., the third non-display area NDA3. According to one example, the plurality of gate drivers GD may be connected to the plurality of pixels P and the plurality of first signal lines SL1 for supplying signals to the plurality of pixels P. The plurality of first signal lines SL1 may include at least one signal line for supplying a signal for driving the pixel P.

The plurality of second signal lines SL2 may be extended in the first direction (Y-axis direction). The plurality of second signal lines SL2 may cross the plurality of first signal lines SL1. The plurality of second signal lines may include a pixel power line VDDL and at least one data line to supply a data voltage to the pixel P. Each of the plurality of second signal lines SL2 may be connected to at least one of a plurality of pads, a pixel power shorting bar VDD or a common power shorting bar VSS. The pixel power shorting bar VDD and the common power shorting bar VSS may be disposed in the fourth non-display area NDA4 that is disposed to face the pad area PA based on the display area DA.

The pixels are provided to overlap at least one of the first signal line SL1 or the second signal line SL2 and emit predetermined light to display an image. The light emission area EA may correspond to an area, which emits light, in the pixel P.

Each of the pixels P may include at least one of a red light emitting portion SP1 (or EA1), a green light emitting portion SP2 (or EA2), a blue light emitting portion SP3 (or EA3) or a white light emitting portion SP4 (or EA4). The red light emitting portion SP1 may include a first light emission area EA1 that emits red light, the green light emitting portion SP2 may include a second light emission area EA2 that emits green light, the blue light emitting portion SP3 may include a third light emission area EA3 that emits blue light and the white light emitting portion SP4 may include a fourth light emission area EA4 that emits white light, but the present disclosure is not limited thereto. Each of the pixels P may include a light emitting portion that emits light of a color other than red, green, blue and white. In addition, various modifications may be made in the arrangement order of the light emitting portions SP1, SP2, SP3 and SP4.

The red light emitting portion SP1, the green light emitting portion SP2, the blue light emitting portion SP3 and the white light emitting portion SP4 may be provided with at least one sub-light emitting portion (or light emission area). One or more sub-light emitting portions of each of the light emitting portions SP1, SP2, SP3 and SP4 may have the same shape and size. For example, as shown in FIG. 5, the red light emitting portion SP1 (or EA1) may include a first red sub-light emitting portion EA1-1 and a second red sub-light emitting portion EA1-2, which are spaced apart from each other in the first direction (Y-axis direction). The green light emitting portion SP2 (or EA2) may include a first green sub-light emitting portion EA2-1 and a second green sub-light emitting portion EA2-2, which are spaced apart from each other in the first direction (Y-axis direction). The blue light emitting portion SP3 (or EA3) may include a first blue sub-light emitting portion EA3-1 and a second blue sub-light emitting portion EA3-2, which are spaced apart from each other in the first direction (Y-axis direction). The white light emitting portion SP4 (or EA4) may include a first white sub-light emitting portion EA4-1 and a second white sub-light emitting portion EA4-2, which are spaced apart from each other in the second direction (X-axis direction). The reason why each of the light emitting portions includes two sub-light emitting portions (or light emission areas) as described herein is that the entire light emitting portion cannot emit light due to a short circuit caused by particles when the particles are deposited on the light emitting portion during a manufacturing process when one light emitting portion (or light emission area) includes only one sub-light emitting portion. Therefore, in the transparent display apparatus 100 according to one embodiment of the present disclosure, at least two sub-light emitting portions (or light emission areas) are provided in one light emitting portion and a plurality of sub-light emitting portions (or light emission areas) are connected to a driving transistor through each of a plurality of repair lines R (shown in FIG. 5), so that a repair line connected to a light emission area in which a defect occurs may be cut when the defect occurs in the light emission area, whereby the other light emission area may emit light to improve light efficiency. For example, the two red sub-light emitting portions EA1-1 and EA1-2 may be connected to the driving transistor provided in the red light emitting portion SP1 through a first repair line R1. The two green sub-light emitting portions EA2-1 and EA2-2 may be connected to the driving transistor provided in the green light emitting portion SP2 through a second repair line R2. The two blue sub-light emitting portions EA3-1 and EA3-2 may be connected to the driving transistor provided in the blue light emitting portion SP3 through a third repair line R3. The two white sub-light emitting portions EA4-1 and EA4-2 may be connected to the driving transistor provided in the white light emitting portion SP4 through a fourth repair line R4. At least a portion of each of the repair lines R1, R2, R3 and R4 may be disposed in the transmissive portion TA1 as shown in FIG. 5.

Referring back to FIGS. 2 and 3, in the transparent display apparatus 100 according to one embodiment of the present disclosure, the non-transmissive portion NTA may be provided between the transmissive portion TA1 and the plurality of light emitting portions SP1, SP2, SP3 and SP4 and between the plurality of light emitting portions SP1, SP2, SP3 and SP4 on the first substrate 110. Since each of the plurality of light emitting portions includes a first sub-light emitting portion and a second sub-light emitting portion, the non-transmissive portion NTA may be provided between the transmissive portion TA1 and the first sub-light emitting portion, between the transmissive portion TA1 and the second sub-light emitting portion and between the first sub-light emitting portion and the second sub-light emitting portion.

The non-transmissive portion NTA may refer to an area that is provided in the display area DA and does not emit light, and may be expressed as a dead zone because it does not emit light. The dead zone according to one example may be an area in which a black matrix and/or a bank is provided, but is not limited thereto, and may refer to an area in which light is not emitted.

The non-transmissive portion NTA may include a first non-transmissive portion NTA1 that is adjacent to a short side of each of the light emitting portion EA1 (or the light emission area) and a second non-transmissive portion NTA2 that is adjacent to a long side of each of the light emitting portion EA1 (or the light emission area). The first non-transmissive portion NTA1 may be disposed to be adjacent to a short side disposed in the first direction (Y-axis direction) in each of the first sub-light emitting portion and the second sub-light emitting portion. The second non-transmissive portion NTA2 may be disposed to be adjacent to a long side disposed in the second direction (X-axis direction) crossing the first direction (Y-axis direction).

A short side L1 of each of the first sub-light emitting portion and the second sub-light emitting portion may include a first short side L1-1 connected to one side of the long side of each of the first sub-light emitting portion and the second sub-light emitting portion and a second short side L1-2 connected to the other side of the long side of each of the first sub-light emitting portion and the second sub-light emitting portion. In this case, one side of the long side of each of the first sub-light emitting portion and the second sub-light emitting portion may refer to a left direction of the second direction (X-axis direction) based on FIG. 3, and the other side of the long side of each of the first sub-light emitting portion and the second sub-light emitting portion may refer to a right direction of the second direction (X-axis direction) based on FIG. 3.

A long side of the first sub-light emitting portion may include a first long side L2-1 that connects one side of the first short side L1-1 of the first sub-light emitting portion with one side of the second short side L1-2 of the first sub-light emitting portion, and a second long side L2-2 that connects the other side of the first short side L1-1 of the first sub-light emitting portion with the other side of the second short sides L1-2 of the first sub-light emitting portion. A long side of the second sub-light emitting portion may include a first long side L2-1 that connects one side of the first short side L1-1 of the second sub-light emitting portion with one side of the second short side L1-2 of the second sub-light emitting portion and a second long side L2-2 that connects the other side of the first short side L1-1 of the second sub-light emitting portion with the other side of the second short sides L1-2 of the second sub-light emitting portion. In this case, one side of the short side of each of the first sub-light emitting portion and the second sub-light emitting portion may refer to an upper direction of the first direction (Y-axis direction) based on FIG. 3, and the other side of the short side of each of the first sub-light emitting portion and the second sub-light emitting portion may refer to a lower direction of the first direction (Y-axis direction) based on FIG. 3.

In more detail, the red light emitting portion SP1 of FIG. 3 will be described as an example. The first non-transmissive portion NTA1 may include a first left non-transmissive portion NTA1-1 adjacent to the first short side L1-1 of the first red sub-light emitting portion EA1-1, a second right non-transmissive portion NTA1-2 adjacent to the second short side L1-2 of the first red sub-light emitting portion EA1-1, a third left non-transmissive portion NTA1-3 adjacent to the first short side L1-1 of the second red sub-light emitting portion EA1-2, and a fourth right non-transmissive portion NTA1-4 adjacent to the second short side L1-2 of the second red sub-light emitting portion EA1-2.

The second non-transmissive portion NTA2 may include a first upper non-transmissive portion NTA2-1 adjacent to the first long side L2-1 of the first red sub-light emitting portion EA1-1, a second lower non-transmissive portion adjacent to the second long side L2-2 of the first red sub-light emitting portion EA1-1, a third upper non-transmissive portion adjacent to the first long side L2-1 of the second red sub-light emitting portion EA1-2, and a fourth lower non-transmissive portion NTA2-3 adjacent to the second long side L2-2 of the second red sub-light emitting portion EA1-2. The second lower non-transmissive portion adjacent to the second long side L2-2 of the first red sub-light emitting portion EA1-1 and the third upper non-transmissive portion adjacent to the first long side L2-1 of the second red sub-light emitting portion EA1-2 may be provided to be in contact with each other between the first red sub-light emitting portion EA1-1 and the second red sub-light emitting portion EA1-2 to constitute one area, and thus may be expressed as an intermediate non-transmissive portion NTA2-2.

In the transparent display apparatus 100 according to one embodiment of the present disclosure, the first non-transmissive portion NTA1 and the second non-transmissive portion NTA2 may be provided to satisfy the following equation:

$$A:2B=(a+b):(c+d+e)$$

In the above equation, 'A' may be a length of the first long side L2-1 of the first sub-light emitting portion, for example, the first red sub-light emitting portion EA1-1. "B" may be a length of the first short side L1-1 of the first sub-light emitting portion, for example, the first red sub-light emitting portion EA1-1. 'a' may refer to a length of the first non-transmissive portion NTA1, which is adjacent to the first short side of the first sub-light emitting portion, in the second direction (X-axis direction). For example, 'a' may be a length of the first left non-transmissive portion NTA1-1, which is adjacent to the first short side L1-1 of the first red sub-light emitting portion EA1-1, in the second direction (X-axis direction). 'b' may be a length of the first non-transmissive portion NTA1, which is adjacent to the second short side L1-2 of the first sub-light emitting portion, in the second direction (X-axis direction). For example, 'b' may be a length of the second right non-transmissive portion NTA1-2, which is adjacent to the second short side L1-2 of the first red sub-light emitting portion EA1-1, in the second direction (X-axis direction). 'c' may be a length of the second non-transmissive portion NTA2, which is adjacent to the first long side of the first sub-light emitting portion, in the first direction (Y-axis direction). For example, 'c' may be a length of the first upper non-transmissive portion NTA2-1, which is adjacent to the first long side L2-1 of the first red sub-light emitting portion EA1-1, in the first direction (Y-axis direction). 'd' may be a length of the second non-transmissive portion, which is adjacent to the second long side of the first sub-light emitting portion or the first long side of the second sub-light emitting portion, in the first direction. For example, 'd' may be a length of the second lower non-transmissive portion, which is adjacent to the second long side L2-2 of the first red sub-light emitting portion EA1-1, in the first direction (Y-axis direction). Otherwise, 'd' may be a length of the third upper non-transmissive portion, which is adjacent to the first long side L2-1 of the second red sub-light emitting portion EA1-2, in the first direction (Y-axis direction). Otherwise, 'd' may be a length of an intermediate non-transmissive portion NTA2-2 in the first direction (Y-axis direction). e' may be a length of the second non-transmissive portion, which is adjacent to the second long side of the second sub-light emitting portion, in the first direction. For example, 'e' may be a length of the fourth lower non-transmissive portion NTA2-3, which is adjacent to the second long side L2-2 of the second red sub-light emitting portion EA1-2, in the first direction (Y-axis direction).

In the transparent display apparatus 100 according to one embodiment of the present disclosure, since the first non-transmissive portion NTA1 and the second non-transmissive portion NTA2 are provided to satisfy the same equation such as A:2B=(a+b):(c+d+e), the size of the dead zone may be reduced, whereby the size of the light emitting portion may be increased or the transmissive portion (or sub-transmissive portion) may be additionally provided. Therefore, the transparent display apparatus 100 according to one embodiment of the present disclosure may improve light efficiency and/or transmittance.

The above equation may be expressed as that related to an area of each of the first non-transmissive portion NTA1 and the second non-transmissive portion NTA2. For example, in the transparent display apparatus 100 according to one embodiment of the present disclosure, the area of the first non-transmissive portion NTA1 may be equal to that of the second non-transmissive portion NTA2. A sum of areas of the first left non-transmissive portion NTA1-1, the second right non-transmissive portion NTA1-2, the third left non-transmissive portion NTA1-3 and the fourth right non-transmissive portion NTA1-4 may be equal to a sum of areas of the first upper non-transmissive portion NTA2-1, the intermediate non-transmissive portion NTA2-2 and the fourth lower non-transmissive portion NTA2-3. This is to reduce the size (or area) of the non-transmissive portion NTA, e.g., the size (or area) of the dead zone with respect to the light emitting portion (or the light emission area).

In order to reduce the size (or area) of the non-transmissive portion NTA for the light emitting portion or the light emission area, e.g., the size or area of the dead zone, the area of the light emitting portion (or the light emission area) and the area of the non-transmissive portion NTA adjacent to the light emitting portion may be provided to satisfy a relation such as (a+b)*(2B)=A*(c+d+e). Referring to FIG. 3, 'a' may refer to a length of the first left non-transmissive portion NTA1-1 or the third left non-transmissive portion NTA1-3 in the second direction (X-axis direction). 'b' may refer to a length of the second right non-transmissive portion NTA1-2 or the fourth right non-transmissive portion NTA1-4 in the second direction (X-axis direction). 'c' may refer to a length of the first upper non-transmissive portion NTA2-1 in the first direction (Y-axis direction). 'd' may refer to a length of the intermediate non-transmissive portion NTA2-2 in the first direction (Y-axis direction). 'e' may refer to a length of the fourth lower non-transmissive portion NTA2-3 in the first direction (Y-axis direction). 'A' may refer to a length of the first red sub-light emitting portion EA1-1 or the second red sub-light emitting portion EA1-2 in the second direction (X-axis direction). 'B' may refer to a length of the first red sub-light emitting portion EA1-1 or the second red sub-light emitting portion EA1-2 in the first direction (Y-axis direction). As shown in FIG. 3, 'A' may be a length of a long side L2 (or second light emitting side) of the first red sub-light emitting portion EA1-1 or the second red sub-light emitting portion EA1-2, and 'B' may be a length of a short side L1 (or first light emitting side) of the first red sub-light emitting portion EA1-1 or the second red sub-light emitting portion EA1-2. The length may be expressed as any one of a width, a height, a thickness, a horizontal length and a vertical length.

According to the above equation, the area of the first non-transmissive portion NTA1, for example, the sum of the areas of the first left non-transmissive portion NTA1-1, the second right non-transmissive portion NTA1-2, the third left non-transmissive portion NTA1-3 and the fourth right non-transmissive portion NTA1-4 may be the areas of the second non-transmissive portion NTA2, for example, the sum of the areas of the first upper non-transmissive portion NTA2-1, the intermediate non-transmissive portion NTA2-2 and the fourth lower non-transmissive portion NTA2-3.

In the transparent display apparatus 100 according to one embodiment of the present disclosure, the non-transmissive portion NTA may be provided at a minimum size by the above equation, whereby the size of the light emitting portion (or the light emission area) and/or the transmissive portion TA1 may be increased to improve light efficiency and/or transmittance.

Meanwhile, an equation for the area of the light emitting portion and the area of the non-transmissive portion adjacent to the light emitting portion may be expressed as a length ration such as A:2B=(a+b):(c+d+e). Therefore, a ratio of a sum length of the first light emitting sides L1 to a length of each of the second light emitting sides L2 may be equal to a ratio of a sum length of the second non-transmissive portions NTA2-1, NTA2-2 and NTA2-3 to a sum length of the first non-transmissive portions NTA1-1 and NTA1-2.

For example, a ratio of a sum length '2B' of the length 'B' of the first light emitting side of the first red sub-light emitting portion EA1-1 or the second red sub-light emitting portion EA1-2 to the length 'A' of the second light emitting side of the first red sub-light emitting portion EA1-1 or the second red sub-light emitting portion EA1-2 may be equal to a ratio of a sum length of the length 'c' of the first upper non-transmissive portion NTA2-1, the length 'd' of the intermediate non-transmissive portion NTA2-2 and the length e' of the fourth lower non-transmissive portion NTA2-3 to a sum length of the length 'a' of the first left non-transmissive portion NTA1-1 or the third left non-transmissive portion NTA1-3 and the length 'b' of the second right non-transmissive portion NTA1-2 or the fourth right non-transmissive portion NTA1-4. Therefore, in the transparent display apparatus 100 according to one embodiment of the present disclosure, the non-transmissive portion NTA may be provided at a minimum size so that light efficiency and/or transmittance may be improved.

The length 'a' of the first left non-transmissive portion NTA1-1 or the third left non-transmissive portion NTA1-3 is a length in the second direction (X-axis direction) perpendicular to a length of the first light emitting side L1 in the first direction (Y-axis direction), and may be expressed as a width of the first left non-transmissive portion NTA1-1 or the third left non-transmissive portion NTA1-3. The length 'b' of the second right non-transmissive portion NTA1-2 or the fourth right non-transmissive portion NTA1-4 may refer to a length in a second direction (X-axis direction) perpendicular to the length of the first light emitting side L1 in the first direction (Y-axis direction), and may be expressed as a width of the second right non-transmissive portion NTA1-2 or the fourth right non-transmissive portion NTA1-4. The length 'c' of the first upper non-transmissive portion NTA2-1 may refer to a length in the first direction (Y-axis direction) perpendicular to the length of the second light emitting side L2 in the second direction (X-axis direction), and may be expressed as a width of the first upper non-transmissive portion NTA2-1. The length 'd' of the intermediate non-transmissive portion NTA2-2 may refer to a length in the first direction (Y-axis direction) perpendicular to the length of the second light emitting side L2 in the second direction (X-axis direction), and may be expressed as a width of the intermediate non-transmissive portion NTA2-2. The length e' of the fourth lower non-transmissive portion NTA2-3 may refer to a length in the first direction (Y-axis direction) perpendicular to the length of the second light emitting side L2 in the second direction (X-axis direction), and may be expressed as a width of the fourth lower non-transmissive portion NTA2-3.

The transparent display apparatus 100 according to one embodiment of the present disclosure may satisfy the following conditions so that the size of the non-transmissive portion NTA, e.g., the dead zone may be reduced.

First, the colored light emitting portions, i.e., the red light emitting portion SP1, the green light emitting portion SP2 and the blue light emitting portion SP3 except the white light emitting portion SP4 are disposed to be adjacent to one another as much as possible, and thus the length of the non-transmissive portion NTA shared by the colored light emitting portions may be increased. The non-transmissive portion NTA (or black matrix) having a wide width outside the light emitting portion helps to prevent a color mixture and light leakage between the colored light emitting portions when the colored light emitting portions are disposed to be adjacent to each other. Therefore, the width of the non-transmissive portion NTA disposed between the colored light emitting portions may be wider than that of the non-transmissive portion NTA disposed between the colored light emitting portion and the transmissive portion TA1 and/or the width of the non-transmissive portion NTA disposed between the white light emitting portion and the transmissive portion TA1. For example, the width of the non-transmissive portion NTA disposed between the colored light emitting portions may be about 24 um, the width of the non-transmissive portion NTA between the colored light emitting portion and the transmissive portion TA1 may be about 19 um, and the width of the non-transmissive portion NTA disposed between the white light emitting portion and the transmissive portion TA1 may be about 4.5 um. Meanwhile, since a color mixture and light leakage should be avoided between the colored light emitting portion and the white light emitting portion, the width of the non-transmissive portion NTA disposed between the colored light emitting portion and the white light emitting portion may be equal to that of the non-transmissive portion NTA disposed between the colored light emitting portions.

The transparent display apparatus 100 according to one embodiment of the present disclosure may include a shared non-transmissive portion SNTA disposed between a plurality of light emitting portions and a non-shared non-transmissive portion NNTA disposed between the plurality of light emitting portions and the transmissive portion TA1. Therefore, the non-transmissive portion NTA (or the first shared non-transmissive portion SNTA1) disposed between the colored light emitting portions and the non-transmissive portion NTA (or the second shared non-transmissive portion SNTA2) disposed between the colored light emitting portion and the white light emitting portion may be included in the shared non-transmissive portion SNTA. In addition, the non-transmissive portion NTA (or the first non-shared non-transmissive portion NNTA1) disposed between the white light emitting portion and the transmissive portion TA1 and the non-transmissive portion NTA (or the second non-shared non-transmissive portion NNTA2) disposed between the colored light emitting portion and the transmissive portion TA1 may be included in the non-shared non-transmissive portion NNTA. As described herein, since the shared non-transmissive portion SNTA has to prevent a color mixture and/or light leakage from occurring between the light emitting portions, a width of the shared non-transmissive portion SNTA may be wider than that of the non-shared non-transmissive portion NNTA. Likewise, the first non-transmissive portion NTA1 adjacent to the short side of the light emitting portion and the second non-transmissive portion NTA2 adjacent to the long side of the light emitting portion may be included in the shared non-transmissive portion SNTA or the non-shared non-transmissive portion NNTA depending on their arrangement positions.

Each of the plurality of light emitting portions may include a first sub-light emitting portion and a second sub-light emitting portion. For example, the red light emitting portion SP1 may include a first red sub-light emitting portion EA1-1 and a second red sub-light emitting portion EA1-2. Therefore, the shared non-transmissive portion SNTA may also include a non-transmissive portion NTA disposed between the first sub-light emitting portion and the second sub-light emitting portion. Likewise, the non-shared non-transmissive portion NNTA may also include a non-transmissive portion NTA disposed between the first sub-light emitting portion and the transmissive portion and between the second sub-light emitting portion and the transmissive portion.

As a result, in the transparent display apparatus 100 according to one embodiment of the present disclosure, the colored light emitting portions may be disposed to be adjacent to each other as much as possible so that a length of the shared non-transmissive portion SNTA having the widest width (or thickest width), which is shared by the colored light emitting portions, whereby a length of the non-shared non-transmissive portion NNTA disposed between the white light emitting portion and the transmissive portion TA1 and a length of the non-shared non-transmissive portion NNTA disposed between the colored light emitting portion and the transmissive portion TA1 may be relatively increased. As a result, the area of the light emitting portion (or the light emission area) and/or the transmissive portion TA1 may be increased.

Second, the white light emitting portion SP4 is independently disposed to be adjacent to the colored light emitting portion within a minimum range, so that the length of the non-transmissive portion NTA shared with the colored light emitting portion may be reduced. As described herein, the width of the non-transmissive portion NTA (or the first non-shared non-transmissive portion NNTA1) disposed between the white light emitting portion and the transmissive portion TA1 may be narrower than the width of the non-transmissive portion NTA (or the first shared non-transmissive portion SNTA1) disposed between the colored light emitting portions, the width of the non-transmissive portion NTA (or the second non-shared non-transmissive portion NNTA2) disposed between the colored light emitting portion and the transmissive portion TA1 and the width of the non-transmissive portion NTA (or the second shared non-transmissive portion SNTA2) disposed between the colored light emitting portion and the white light emitting portion. Therefore, as the white light emitting portion SP4 is disposed so as not to be adjacent to the colored light emitting portion as much as possible, the entire width (or size) of the non-transmissive portion NTA may be reduced. Therefore, in the transparent display apparatus 100 according to one embodiment of the present disclosure, as shown in FIGS. 2 and 5, the white light emitting portion SP4 may be disposed in the form of a bridge between the colored light emitting portions including the red light emitting portion SP1, the green light emitting portion SP2 and the blue light emitting portion SP3.

As shown in FIG. 2, the white light emitting portion SP4 is disposed in the form of a bridge between the colored light emitting portions so that the white light emitting portion SP4 may be disposed to be adjacent to the transmissive portions TA1. Since the length of the non-transmissive portion NTA (or the first non-shared non-transmissive portion NNTA1) provided between the white light emitting portion SP4 and the transmissive portion TA1 is 4.5 um that is the smallest, in the transparent display apparatus 100 according to one embodiment of the present disclosure, the width (or size) of the non-transmissive portion NTA surrounding the light emitting portion (or the light emission area) may be reduced, whereby the size of the light emitting portion (or the light emission area) and/or the transmissive portion TA1 may be relatively increased.

Third, the area of the light emitting portion (or the light emission area) and the area of the non-transmissive portion NTA adjacent to the light emitting portion may be provided to satisfy a relation such as $(a+b)*(2B)=A*(c+d+e)$. As shown in FIG. 3, the area of the first non-transmissive portion NTA1 may be equal to that of the second non-transmissive portion NTA2. In more detail, a sum of the areas of the first left non-transmissive portion NTA1-1, the second right non-transmissive portion NTA1-2, the third left non-transmissive portion NTA1-3 and the fourth right non-transmissive portion NTA1-4 may be equal to a sum of the areas of the first upper non-transmissive portion NTA2-1, the intermediate non-transmissive portion NTA2-2 and the fourth lower non-transmissive portion NTA2-3.

In the transparent display apparatus 100 according to one embodiment of the present disclosure, the light emitting portions (or light emission areas), the transmissive portion TA1 and the non-transmissive portion NTA may be provided to satisfy the above three conditions, so that the area of the non-transmissive portion NTA may be reduced. As a result, since the size of the light emitting portion (or the light emission area) and/or the transmissive portion TA1 may be increased, light efficiency and/or transmittance may be improved.

Meanwhile, in relation to the first condition, the case that the colored light emitting portions, e.g., the red light emitting portion SP1, the green light emitting portion SP2 and the blue light emitting portion SP3 are disposed to be adjacent to one another as much as possible may be implemented like ⓐ, ⓑ, ⓒ and ⓓ of FIG. 4. In this case, since a horizontal length of the red light emitting portion SP1 is too longer than a vertical length thereof in case of ⓐ and ⓒ, the length of the non-transmissive portion NTA disposed between two red light emitting portions, e.g., the length of the shared non-transmissive portion having a width of 24 um is too long, whereby it is difficult to reduce the width (or size) of the non-transmissive portion NTA.

In the case of ⓑ, since two green light emitting portions SP2 are disposed between the red light emitting portion SP1 and the blue light emitting portion SP3, a repair line R connecting the two green light emitting portions has no option but to be disposed in the red light emitting portion SP1 or the blue light emitting portion SP3. In this case, the repair line R may overlap the red light emitting portion SP1 or the blue light emitting portion SP3, so that a parasitic cap may occur between the repair line R and the circuit provided in the red light emitting portion SP1 or the blue light emitting portion SP3 to cause signal interference, whereby light may not be emitted normally. Therefore, the colored light emitting portion for minimizing the area of the non-transmissive portion NTA may be disposed like ⓓ. In the transparent display apparatus 100 according to one embodiment of the present disclosure, the arrangement of the colored light emitting portions, e.g., the red light emitting portion SP1, the green light emitting portion SP2 and the blue light emitting portion SP3, is implemented like ⓓ, so that the area of the non-transmissive portion NTA that is adjacent to the colored light emitting portion may be reduced. Meanwhile, as shown in FIG. 5, when the white light emitting portion SP4 is disposed to be adjacent to the transmissive portion TA1, since the white light emitting portion SP4 has a dead zone having the smallest width of 4.5 um, the white light emitting portion SP4 may be independently disposed to reduce the width (or size) of the non-transmissive portion NTA. Therefore, the white light emitting portion SP4 may be disposed in the form of a bridge at one side (or the other side of the blue light emitting portion SP3) of the green light emitting portion SP2.

In more detail, as shown in FIG. 5, the red light emitting portion SP1 may be disposed in such a manner that the two red sub-light emitting portions EA1-1 and EA1-2 are spaced apart from each other in the first direction (Y-axis direction) while having a long side (or the second light emitting side L2) in the second direction (the X-axis direction) and having a short side (or the first light emitting side L1) in the first direction (Y-axis direction). Therefore, the transmissive portion TA1 and the sub transmissive portion STA may be disposed at both sides of the two red sub-light emitting portions EA1-1 and EA1-2. The sub-transmissive portion STA may be a space generated by satisfying three conditions for minimizing the width (or size and area) of the non-transmissive portion NTA. The sub-transmissive portion STA according to one example may be provided between one side of the red light emitting portion SP1 and the transmissive portion TA1.

The green light emitting portion SP2 and the blue light emitting portion SP3 may be disposed below the red light emitting portion SP1 in the first direction (Y-axis direction). The green light emitting portion SP2 may be disposed in such a manner that the two green sub-light emitting portions EA2-1 and EA2-2 are spaced apart from each other in the first direction (Y-axis direction) while having a short side in the second direction (X-axis direction) and having a long side in the first direction (Y-axis direction). Therefore, the second white sub-light emitting portion EA4-2 of the white light emitting portion SP4 and the transmissive portion TA1 may be disposed at one side of the first green sub-light emitting portion EA2-1 of the two green sub-light emitting portions EA2-1 and EA2-2, and only the transmissive portion TA1 may be disposed at one side of the second green sub-light emitting portion EA2-2. The blue light emitting portion SP3 may be disposed at the other side of the two green sub-light emitting portions EA2-1 and EA2-2.

The blue light emitting portion SP3 may be disposed in such a manner that the two blue sub-light emitting portions EA3-1 and EA3-2 are spaced apart from each other in the first direction (Y-axis direction) while having a short side in the second direction (X-axis direction) and a long side in the first direction (Y-axis direction). Therefore, the green light emitting portion SP2 may be disposed at one side of the two blue sub-light emitting portions EA3-1 and EA3-2, the first white sub-light emitting portion EA4-1 of the white light emitting portion SP4 of another pixel P and the transmissive portion TA1 may be disposed at the other side of the first blue sub-light emitting portion EA3-1 of the two blue sub-light emitting portions EA3-1 and EA3-2, and only the transmissive portion TA1 of another pixel P may be disposed at the other side of the second blue sub-light emitting portion EA3-2.

The white light emitting portion SP4 may be disposed in such a manner that the two white sub-light emitting portions EA4-1 and EA4-2 are provided in a substantially square shape between the colored light emitting portions and spaced apart from each other in the second direction (X-axis direction). Therefore, the first blue sub-light emitting portion of another pixel P may be disposed at one side of the first white sub-light emitting portion EA4-1, and the first green sub-light emitting portion EA2-1 may be disposed at the other side of the second white sub-light emitting portion EA4-2.

As a result, each of the red light emitting portion SP1, the green light emitting portion SP2, the blue light emitting portion SP3 and the white light emitting portion SP4, each of which includes two sub-light emitting portions (or light emission areas), may be disposed to be adjacent to the transmissive portion TA1 or the sub-transmissive portion STA. Therefore, the repair line R connecting two sub-light emitting portions (or light emission areas) of each of the light emitting portions SP1, SP2, SP3 and SP4 may be disposed in the transmissive portion TA1. In this case, the case that the repair line R is disposed in the transmissive portion TA1 may mean that at least a portion of the repair line R is disposed in the transmissive portion TA1. Therefore, a parasitic cap or signal interference that may occur when the repair line is disposed to overlap the sub-light emitting portion (or the light emission area) may be avoided.

Referring back to FIG. 5, the first light emitting portion may be provided to have an area larger than that of each of the second light emitting portion, the third light emitting portion and the fourth light emitting portion. The red light emitting portion SP1 may be provided to have an area larger than that of each of the green light emitting portion SP2, the blue light emitting portion SP3 and the white light emitting portion SP4.

In some embodiments, the size of the light emitting portion may be determined in view of lifetime and efficiency. For example, the size of the light emitting portion may be smaller as the lifetime of the light emitting portion becomes longer and light emitting efficiency becomes higher. On the other hand, the size of the light emitting portion may be increased as the lifetime of the light emitting portion becomes shorter and light emitting efficiency becomes lower.

First, in view of lifetime, in case of a general OLED, when brightness of the light emitting portion, e.g., luminance is deteriorated as much as about 5 to 10%, a user may recognize luminance deterioration. In more detail, the user may better recognize luminance deterioration of colored light, e.g., red light, blue light and green light than white light. On the other hand, in case of a transparent OLED, e.g., in case of the transparent display apparatus 100 of the present disclosure, since the user recognizes brightness (luminance) of the light emitting portion along with a rear background, the user may recognize luminance deterioration when brightness of the light emitting portion is deteriorated as much as 7 to 30%. In more detail, the user may better recognize luminance deterioration of the blue light than the red light, and may better recognize luminance deterioration of the green light than the white light. This may mean that luminance of the red light is lower than that of the blue light and luminance of the white light is lower than that of the green light. Meanwhile, the case that luminance is low may mean that brightness drops faster when the same voltage is continuously applied, and this may mean that lifetime is shorter. Therefore, since the size of the red light emitting portion is larger than that of the blue light emitting portion, luminance of the red light emitting portion may be improved even with a low voltage, whereby lifetime of the red light emitting portion may be increased.

Also, since the size of the red light emitting portion is larger than that of the blue light emitting portion, the user's perception for luminance deterioration of the blue light may be relatively lowered, whereby a sense of difference of an image, which is caused by luminance deterioration of the blue light, may be eliminated.

In addition, in case of a general OLED, even though luminance of the red light emitting portion is deteriorated as much as about 5%, the user may recognize luminance deterioration. On the other hand, in case of a transparent OLED, since the user may see the rear background through the transmissive portion, the user may not recognize luminance deterioration until luminance of the red light emitting portion is reduced as much as about 7%. Therefore, in the transparent display apparatus 100 of the present disclosure, the size of the colored light emitting portion, which includes the red light emitting portion, may be more increased than the general OLED. Therefore, since the transparent display apparatus 100 of the present disclosure may increase the size of the light emitting portion as compared with the case of the general OLED, luminance of an image may be improved, whereby visibility of the image for the user may be further improved even though the rear background is present.

Next, in view of light emitting efficiency, since brightness (luminance) is low at the same voltage as light emitting efficiency becomes lower, the light emitting portion should be designed to have a great size. Generally, since light emitting efficiency of the blue light is the lowest, the sizes of the light emitting portions should be increased in the order of the green light emitting portion<the red light emitting portion<the blue light emitting portion. However, as described herein, since the user may better recognize luminance deterioration of the blue light than the red light, the size of the red light emitting portion may be larger than that of the blue light emitting portion, whereby the user's perception for luminance deterioration of the blue light may be lowered. In addition, since lifetime of the red light emitting portion is shorter than that of the blue light emitting portion, the size of the red light emitting portion is larger than that of the blue light emitting portion, whereby luminance of the red light and lifetime of the red light emitting portion may be increased.

As a result, in the transparent display apparatus 100 according to one embodiment of the present disclosure, since luminance and lifetime of the red light emitting portion are lower than those of the light emitting portion having another color in view of lifetime and efficiency, the size of the red light emitting portion SP1 may be larger than that of the light emitting portion having another color, whereby lifetime of the red light emitting portion may be increased and luminance of the red light may be improved.

In addition, since luminance of the red light may be improved as the size of the red light emitting portion is increased, the user's perception for luminance deterioration of the blue light may be lowered. Therefore, in the transparent display apparatus 100 according to one embodiment of the present disclosure, the user may not recognize a sense of difference of an image due to luminance deterioration of blue light having low efficiency, and overall lifetime of the light emitting portion may be increased.

Referring to FIG. 6, the shared non-transmissive portion SNTA may include a first shared non-transmissive portion SNTA1 and a second shared non-transmissive portion SNTA2.

The first shared non-transmissive portion SNTA1 may refer to a non-transmissive portion NTA disposed among the plurality of colored light emitting portions SP1, SP2 and SP3 (or EA1, EA2 and EA3). For example, the first shared non-transmissive portion SNTA1 may be a non-transmissive portion NTA disposed between the first green sub-light emitting portion EA2-1 and the first blue sub-light emitting portion EA3-1 in FIG. 6.

The second shared non-transmissive portion SNTA2 may refer to a non-transmissive portion disposed between each of the plurality of colored light emitting portions SP1, SP2 and SP3 (or EA1, EA2 and EA3) and the white light emitting portion EA4. For example, the second shared non-transmissive portion SNTA2 may be a non-transmissive portion NTA2 disposed between the first green sub-light emitting portion EA2-1 and the second white sub-light emitting portion EA4-2 in FIG. 6.

The first shared non-transmissive portion SNTA1 and the second shared non-transmissive portion SNTA2 may have the same width to prevent a color mixture and/or light leakage from occurring among the light emitting portions EA1, EA2, EA3 and EA4. For example, as shown in FIG. 6, a width W1-1 of the first shared non-transmissive portion SNTA1 may be equal to a width W1-2 of the second shared non-transmissive portion SNTA2. For example, the width W1-1 of the first shared non-transmissive portion SNTA1 may be 24 um.

Referring back to FIG. 6, the non-shared non-transmissive portion NNTA may include a first non-shared non-transmissive portion NNTA1 and a second non-shared non-transmissive portion NNTA2.

The first non-shared non-transmissive portion NNTA1 may refer to a non-transmissive portion disposed between the white light emitting portion EA4 and the transmissive portion TA1. For example, the first non-shared non-transmissive portion NNTA1 may be a non-transmissive portion NTA disposed between the second white sub-light emitting portion EA4-2 and the transmissive portion TA1 in FIG. 6.

The second non-shared non-transmissive portion NNTA2 may refer to a non-transmissive portion disposed between each of the colored light emitting portions EA1, EA2 and EA3 and the transmissive portion TA1. For example, the second non-shared non-transmissive portion NNTA2 may be a non-transmissive portion NTA disposed between the second red sub-light emitting portion EA1-2 and the transmissive portion TA1 (or the sub-transmissive portion STA) in FIG. 6.

Since the second non-shared non-transmissive portion NNTA2 is disposed between the colored light emitting portion and the transmissive portion, the colored light (red, green or blue) of the colored light emitting portion may be emitted toward the transmissive portion. On the other hand, since the first non-shared non-transmissive portion NNTA1 is disposed between the white light emitting portion and the transmissive portion, the white light may be emitted toward the transmissive portion. In this case, the user may better recognize the colored light than the white light. Therefore, in the transparent display apparatus 100 according to one embodiment of the present disclosure, since a width W2-2 of the second non-shared non-transmissive portion NNTA2 is wider than a width W2-1 of the first non-shared non-transmissive portion NNTA1, the colored light (red, green or blue) may be prevented from being emitted through the transmissive portion TA1, whereby visibility deterioration of the background or image behind the display panel may be avoided.

Referring to FIG. 5, in the transparent display apparatus 100 according to one embodiment of the present disclosure, the colored light emitting portion may include a red light emitting portion EA1, a green light emitting portion EA2 and a blue light emitting portion EA3. As shown in FIG. 5, at least a portion of the red light emitting portion EA1 may overlap each of the green light emitting portion EA2 and the blue light emitting portion EA3 in the first direction (Y-axis direction). The white light emitting portion EA4 may be disposed to be adjacent to the green light emitting portion EA2 in the second direction (X-axis direction), and may be disposed to be adjacent to the transmissive portion TA1 in the first direction (Y-axis direction). This is to reduce the width (or size) of non-transmissive portions NTA adjacent to each of the light emitting portions EA1, EA2, EA3 and EA4.

Meanwhile, as described herein, since the red light emitting portion EA1 has lifetime and efficiency, which are lower than those of the other light emitting portions EA2, EA3 and EA4, the size of the red light emitting portion EA1 may be greater than the size of each of the other light emitting portions EA2, EA3 and EA4. However, as shown in FIG. 5, since the long side L2 of the red light emitting portion EA1 is disposed in the second direction (X-axis direction) and the short side L1 thereof is disposed in the first direction (Y-axis direction), the red light emitting portion EA1 may be provided in a rectangular shape that is long in a horizontal direction based on FIG. 5. On the other hand, since the short side of the green light emitting portion EA2 is disposed in the second direction (X-axis direction) and the long side thereof is disposed in the first direction (Y-axis direction), the green light emitting portion EA2 may be provided in a rectangular shape that is long in a vertical direction based on FIG. 5. Therefore, as shown in FIG. 6, a width SP1W of the red light emitting portion EA1 may be equal to or narrower than a sum width of a width SP2W of the green light emitting portion EA2 and a width SP3W of the blue light emitting portion EA3.

Referring to FIG. 6 as an example, when the width SP1W of the red light emitting portion EA1 is equal to the sum width of the width SP2W of the green light emitting portion EA2 and the width SP3W of the blue light emitting portion EA3, since the non-transmissive portion, e.g., the first shared non-transmissive portion SNTA1 may be disposed between the green light emitting portion EA2 and the blue light emitting portion EA3, the green light emitting portion EA2 may be disposed to be more protruded toward a left side than the red light emitting portion EA1.

Even though the width SP1W of the red light emitting portion EA1 is equal to the sum width of the width SPW2 of the green light emitting portion EA2 and the width SP3W of the blue light emitting portion EA3, the width W2-2 of the second non-shared non-transmissive portion NNTA2 between the second red sub-light emitting portion EA1-2 and the transmissive portion TA1 is narrower than the width W1-1 of the first shared non-transmissive portion SNTA1 between the green light emitting portion EA2 and the blue light emitting portion EA3, a predetermined space may be further generated at one side of the red light emitting portion EA1, for example, at the left side of the red light emitting portion EA1. Therefore, the sub-transmissive portion STA may be provided in a space formed at the left side of the red light emitting portion EA1.

In an example, when the width SP1W of the red light emitting portion EA1 is narrower than the sum width of the width SP2W of the green light emitting portion EA2 and the width SP3W of the blue light emitting portion EA3, the green light emitting portion EA2 may be disposed to be further protruded toward the left side of the red light emitting portion EA1. Therefore, the size of the space generated at the left side of the red light emitting portion EA1 may be increased.

In the transparent display apparatus 100 according to one embodiment of the present disclosure, the space generated at the left side of the red light emitting portion EA1 may be used as the sub-transmissive portion STA. As shown in FIG. 5, the sub-transmissive portion STA may be provided between the transmissive portion TA1 and the red light emitting portion EA1. The sub-transmissive portion STA may be generated by satisfying three conditions for minimizing the width (or size) of the non-transmissive portion NTA adjacent to the light emitting portions. The sub-transmissive portion STA may be provided to have a predetermined width STAW (shown in FIG. 6) between the red light emitting portion and the transmissive portion TA1. In more detail, referring to FIG. 6, the sub-transmissive portion STA may be provided by the width STAW obtained by subtracting the sum width of the width SP1W of the second red sub-light emitting portion EA1-2 and the width W2-2 (or 'a') of the second non-shared non-transmissive portion NNTA2 adjacent to the left side of the second red sub-light emitting portion EA1-2 from the sum width of the width SP2W of the first green sub-light emitting portion EA2-1, the width SP3W of the first blue sub-light emitting portion EA3-1, the width W1-2 of the second shared non-transmissive portion SNTA2 adjacent to the left side of the first green sub-light emitting portion EA2-1 and the width W1-1 of the first shared non-transmissive portion SNTA1 disposed between the first green sub-light emitting portion EA2-1 and the first blue sub-light emitting portion EA3-1. Therefore, the transparent display apparatus 100 according to one embodiment of the present disclosure may further include the sub-transmissive portion STA having a predetermined width STAW in the transmissive portion TA1 adjacent to the light emitting portions, thereby improving transmittance.

The sub-transmissive portion STA may be formed integrally with the adjacent transmissive portion TA1 or may be formed separately from the transmissive portion TA1. When the sub-transmissive portion STA is formed integrally with the adjacent transmissive portion TA1, the area of the transmissive portion may be increased and thus transmittance may be improved. Meanwhile, since the sub-transmissive portion STA is provided to be adjacent to the red light emitting portion EA1 (or the left side of the red light emitting portion EA1), the transparent display apparatus 100 may have a structural feature in which the area of the transmissive portion adjacent to the red light emitting portion EA1 (or the left side of the red light emitting portion EA1) is larger than that of the transmissive portion adjacent to the other light emitting portions.

In the above example, it has been described that the space generated between the red light emitting portion EA1 and the transmissive portion TA1 is used as the sub-transmissive portion STA to improve transmittance, but the size of the red light emitting portion EA1 and/or the green light emitting portion EA2 may be increased so that the red light emitting portion EA1 and/or the green light emitting portion EA2 is disposed in the space. In this case, since the size of the transmissive portion TA1 is not changed, light emitting efficiency of the red light and/or the green light may be further improved without deterioration of transmittance. In an example, the blue light emitting portion EA3 and/or the white light emitting portion EA4 may be additionally provided in the space to improve light emitting efficiency of the blue light and/or the white light without deterioration of transmittance.

Hereinafter, an example in which the first signal line SL1, the second signal line SL2 and the driving transistor are disposed will be described in detail with reference to FIGS. 7 and 8.

Figure 7:
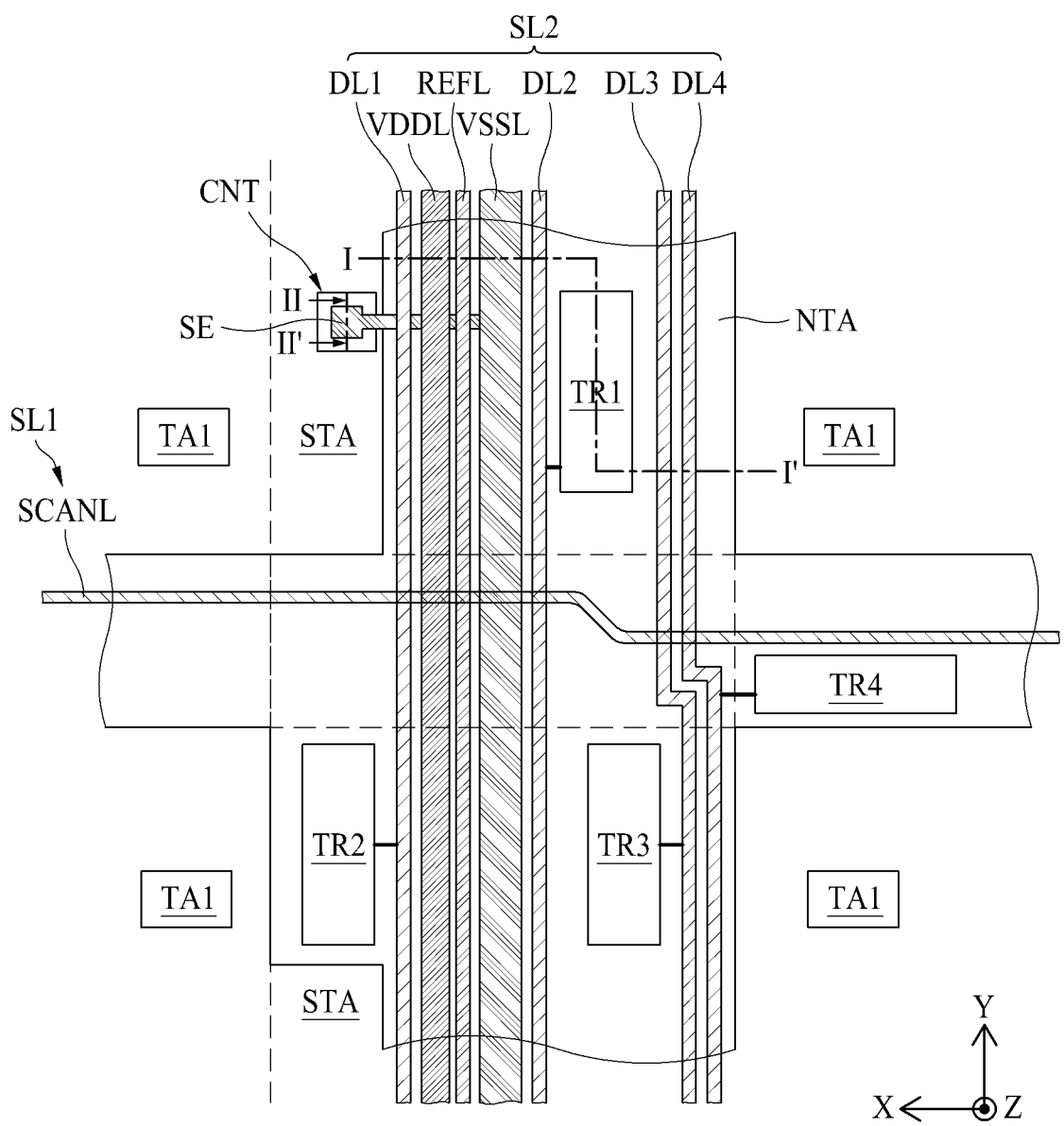
FIG. 7 is a view illustrating an example in which a plurality of signal lines and a plurality of driving transistors are disposed.
Figure 8:
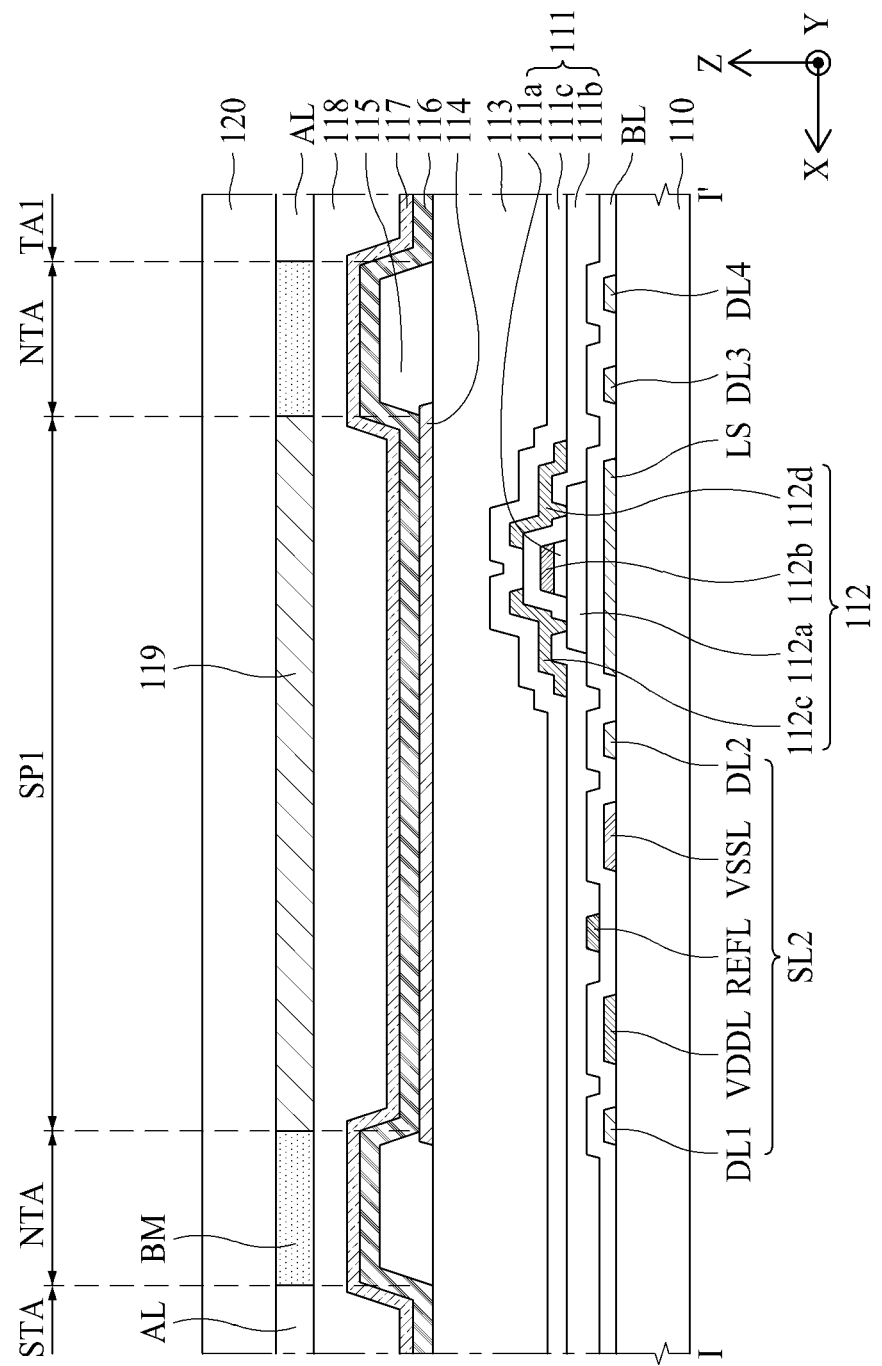
FIG. 8 is a cross-sectional view taken along line I-I' shown in FIG. 7.

FIG. 7 is a view illustrating an example in which a plurality of signal lines and a plurality of driving transistors are disposed, and FIG. 8 is a cross-sectional view taken along line I-I' shown in FIG. 7.

As described herein, the display area DA includes a light emitting portion EA (or SP), a transmissive portion TA1, a non-transmissive portion NTA and a sub-transmissive portion STA. The non-transmissive portion NTA may be extended in the first direction (Y-axis direction) between adjacent transmissive portions TA1, or may be extended in the second direction (X-axis direction) between adjacent transmissive portions TA1.

The second signal line SL2 and the driving transistors TR1, TR2 and TR3 of the light emitting portions SP1, SP2 and SP3, which are disposed to overlap the second signal line SL2, may be disposed in the non-transmissive portion NTA. For example, at least a portion of the first light emitting portion EA1 (or SP1), the second light emitting portion EA2 (or SP2) and the third light emitting portion EA3 (or SP3) may be provided to overlap the second signal line SL2, and may be alternately disposed along the second signal line SL2. The second signal line SL2, the first driving transistor TR1 of the first light emitting portion SP1, the second driving transistor TR2 of the second light emitting portion SP2 and the third driving transistor TR3 of the third light emitting portion SP3 may be disposed in the non-transmissive portion NTA in the vertical direction based on FIG. 7. The first signal line SL1 and the fourth driving transistor TR4 of the fourth light emitting portion SP4 may be disposed in the non-transmissive portion NTA in the horizontal direction based on FIG. 7.

The second signal line SL2 may be provided in the non-transmissive portion NTA and extended in the first direction (Y-axis direction). The second signal line SL2 may include a plurality of signal lines, for example, a power line. The power line may include a first power line and a second power line.

The first power line may be provided in the non-transmissive portion NTA and extended in the first direction (Y-axis direction). In one embodiment, the first power line may be a pixel power line VDDL for supplying a first power source to a first electrode 114 of each of the light emitting portions SP1, SP2, SP3 and SP4.

The second power line may be provided in the non-transmissive portion NTA and extended in the first direction (Y-axis direction) in parallel with the first power line. In one embodiment, the second power line may be a common power line VSSL for supplying a second power source to a second electrode 117 of each of the light emitting portions SP1, SP2, SP3 and SP4.

For example, the second signal line SL2 may further include a first data line DL1, a reference line REFL, a second data line DL2, a third data line DL3 and a fourth data line DL4.

In detail, the reference line REFL may be provided in the non-transmissive portion NTA and extended in the first direction (Y-axis direction). The reference line REFL may supply a reference voltage (or an initialization voltage or a sensing voltage) to the driving transistor of each of the light emitting portions SP1, SP2, SP3 and SP4 provided in the display area DA.

The first data line DL1 may be provided in the non-transmissive portion NTA, may be disposed on a first side of the reference line REFL, and may be extended in the first direction (Y-axis direction). The first data line DL1 may supply a data voltage to at least a portion of the light emitting portions SP1, SP2, SP3 and SP4 provided in the display area DA.

For example, the first data line DL1 may supply a first data voltage to the second driving transistor TR2 of the second light emitting portion SP2 disposed on the first side of the reference line REFL.

The second data line DL2 may be provided in the non-transmissive portion NTA, may be disposed on a second side of the reference line REFL, and may be extended in the first direction (Y-axis direction). In this case, the second side of the reference line REFL may be a side facing the first side. For example, when the first side is a left side of the reference line REFL, the second side may be a right side of the reference line REFL. The second data line DL2 may supply a data voltage to one of the other light emitting portions except the light emitting portion, which is connected to the first data line DL1, among the light emitting portions SP1, SP2, SP3 and SP4 provided in the display area DA.

For example, the second data line DL2 may supply a second data voltage to the first driving transistor TR1 of the first light emitting portion SP1 disposed on the second side of the reference line REFL.

The third data line DL3 may be provided in the non-transmissive portion NTA, may be disposed on one side of the second data line DL2, for example, on a right side of the second data line DL2, and may be extended in the first direction (Y-axis direction). The third data line DL3 may supply a data voltage to one of the other light emitting portions except the light emitting portion, which is connected to each of the first data line DL1 and the second data line DL2, among the light emitting portions SP1, SP2, SP3 and SP4 provided in the display area DA.

For example, the third data line DL3 may supply a third data voltage to the third driving transistor TR3 of the third light emitting portion SP3 disposed below first driving transistor TR1.

The fourth data line DL4 may be provided in the non-transmissive portion NTA, may be disposed on one side of the third data line DL3, for example, on a right side of the third data line DL3, and may be extended in the first direction (Y-axis direction). The fourth data line DL4 may supply a data voltage to the other light emitting portion except the light emitting portion, which is connected to each of the first data line DL1, the second data line DL2 and the third data line DL3, among the light emitting portions SP1, SP2, SP3 and SP4 provided in the display area DA.

For example, the fourth data line DL4 may supply a fourth data voltage to the fourth driving transistor TR4 of the fourth light emitting portion SP4 disposed in the second direction (X-axis direction) between the first driving transistor TR1 and the third driving transistor TR3.

In the transparent display apparatus 100 according to one embodiment of the present disclosure, the reference line REFL may be not be disposed to be adjacent to the first to fourth data lines DL1, DL2, DL3 and DL4. A constant voltage may be applied to the reference line REFL, whereas the data voltage may be applied to the data lines DL1, DL2, DL3 and DL4 in the form of a pulse. When the reference line REFL is disposed to be adjacent to the data lines DL1, DL2, DL3 and DL4, a crosstalk phenomenon due to capacitive coupling may occur between the reference line REFL and the data lines DL1, DL2, DL3 and DL4 when a voltage change occurs in the data lines DL1, DL2, DL3 and DL4. In this case, the voltage of the reference line REFL may be changed, and furthermore, luminance of the light emitting portions SP1, SP2, SP3 and SP4 may be changed. As a result, a dark line or a bright line may occur.

The display panel (or the transparent display panel) of the transparent display apparatus 100 of the present disclosure may include a transmissive portion TA1 of a large area to make sure of light transmittance, and may include a non-transmissive portion NTA of a relatively narrow area. Since the plurality of signal lines have no transmittance, the plurality of signal lines may be disposed in the non-transmissive portion NTA. In this case, since the display panel (or the transparent display panel) includes a plurality of signal lines disposed in the non-transmissive portion NTA of a narrow area as compared with a general display panel, a spaced distance between the signal lines may be reduced. For this reason, in the transparent display panel, a parasitic capacitance between the reference line REFL and the data lines DL1, DL2, DL3 and DL4 may be increased, and a crosstalk phenomenon caused by coupling may occur more seriously.

In the transparent display apparatus 100 according to one embodiment of the present disclosure, in order to reduce parasitic capacitance between the reference line REFL and the data lines DL1, DL2, DL3 and DL4 in a limited space, the reference line REFL and the data lines DL1, DL2, DL3 and DL4 may not be disposed to be adjacent to each other.

For example, in the transparent display apparatus 100 according to one embodiment of the present disclosure, the pixel power line VDDL or the common power line VSSL may be disposed between the reference line REFL and the first data line DL1, so that the reference line REFL and the first data line DL1 may not be disposed to be adjacent to each other. In addition, in the transparent display apparatus 100 according to one embodiment of the present disclosure, the pixel power line VDDL or the common power line VSSL may be disposed between the reference line REFL and the second data line DL2, so that the reference line REFL and the second data line DL2 may not be disposed to be adjacent to each other. Since a constant power voltage other than a pulse shape is applied to the pixel power line VDDL or the common power line VSSL, an influence of the pixel power line VDDL or the common power line VSSL on the reference line REFL may be very small.

In the transparent display apparatus 100 according to one embodiment of the present disclosure, different signal lines may be disposed between the reference line REFL and the data lines DL1 and DL2 so that a spaced distance between the reference line REFL and the data lines DL1 and DL2 may be increased. Therefore, the transparent display apparatus 100 according to one embodiment of the present disclosure may reduce parasitic capacitance between the reference line REFL and the data lines DL1 and DL2.

Since the third data line DL3 and the fourth data line DL4 are spaced apart from the reference line REFL rather than the second data line DL2, the parasitic capacitance between the reference line REFL and the data lines DL3 and DL4 may be further reduced.

Meanwhile, in the transparent display apparatus 100 according to one embodiment of the present disclosure, the reference line REFL and the data lines DL1, DL2, DL3 and DL4 may be provided in different layers. In some embodiments, the reference line REFL may be provided in a first layer, for example, between an interlayer insulating layer 111b and a buffer layer BL, and the data lines DL1, DL2, DL3 and DL4 may be provided in a second layer different from the first layer, for example, between the buffer layer BL and the first substrate 110.

In one embodiment, the reference line REFL may be provided on the same layer as one of elements constituting the driving transistor TR (or 112). In some embodiments, the reference line REFL may be provided on the same layer as any one of an active layer 112a, a gate electrode 112b, a source electrode 112c and a drain electrode 112d of the driving transistor 112. For example, as shown in FIG. 8, the reference line REFL may be provided on the same layer as the gate electrode 112b.

In one embodiment, the data lines DL1, DL2, DL3 and DL4 may be provided between the driving transistor 112 and the first substrate 110. For example, the data lines DL1, DL2, DL3 and DL4 may be provided on the same layer as a light shielding layer LS as shown in FIG. 8.

In the transparent display apparatus 100 according to one embodiment of the present disclosure, the reference line REFL and the data lines DL1, DL2, DL3 and DL4 are provided in different layers, so that a spaced distance between the reference line REFL and the data lines DL1, DL2, DL3 and DL4 in a limited space may be maximized. Therefore, the transparent display apparatus 100 according to one embodiment of the present disclosure may reduce parasitic capacitance between the reference line REFL and the data lines DL1, DL2, DL3 and DL4.

Meanwhile, based on FIG. 7, the first signal line SL1 and the driving transistor TR4 of the fourth light emitting portion SP4, which is disposed to spaced apart or overlap the first signal line SL1, may be provided in the non-transmissive portion NTA in the horizontal direction, e.g., in the second direction (the X-axis direction).

The first signal line SL1 may be provided in the non-transmissive portion NTA and extended in the second direction (X-axis direction). The first signal line SL1 may include a plurality of signal lines, and for example, may include at least one scan line SCANL.

For illustrative purposes only, one scan line SCANL is provided in the non-transmissive portion NTA in the description herein, which does not limit the scope of the disclosure. Two or more scan lines may be provided in the non-transmissive portion NTA.

In some embodiments, the scan line SCANL may be provided in the non-transmissive portion NTA and extended in the second direction (X-axis direction). The scan line SCANL may supply a scan signal to at least a portion of the light emitting portions SP1, SP2, SP3 and SP4 provided in the display area DA.

For example, the scan line SCANL may supply a scan signal to the first driving transistor TR1 of the first light emitting portion SP1, the second driving transistor TR2 of the second light emitting portion SP2, the third driving transistor TR3 of the third light emitting portion SP3 and the fourth driving transistor TR4 of the fourth light emitting portion SP4.

The scan line SCANL may be formed on a layer different from the second signal line SL2. In some embodiments, the scan line SCANL may be formed on a layer different from the first data line DL1, the reference line REFL, the second data line DL2, the third data line DL3 and the fourth data line DL4.

In one embodiment, the scan line SCANL may be provided on the same layer as one of the elements constituting the driving transistor 112. In some embodiments, the scan line SCANL may be provided on the same layer as any one of the active layer 112a, the gate electrode 112b, the source electrode 112c and the drain electrode 112d of the driving transistor 112. For example, the scan line SCANL may be provided on the same layer as the source electrode 112c and the drain electrode 112d.

Referring back to FIG. 1, the non-display area NDA may include a pad area PA in which pads are disposed, and at least one gate driver GD.

In some embodiments, the non-display area NDA may include a first non-display area NDA1 disposed at one side of the display area DA, a second non-display area NDA2 disposed at the other side perpendicular to one side of the display area DA, a third non-display area NDA3 disposed to be parallel with the second non-display area NDA2 with the display area DA interposed therebetween, and a fourth non-display area NDA4 disposed to be parallel with the first non-display area NDA1 with the display area DA interposed therebetween. In this case, the pad area PA may be disposed in the first non-display area NDA1.

The fourth non-display area NDA4 may be provided with a pixel power shorting bar VDD connected to a plurality of pixel power lines VDDL provided in the display area DA and a common power shorting bar VSS connected to a plurality of common power lines VSSL provided in the display area DA.

The gate driver GD may be provided in any one of the second non-display area NDA2 and the third non-display area NDA3. The gate driver GD is connected to scan lines to supply scan signals. The gate driver GD may be disposed on one side or both sides of the display area DA in a gate driver in panel (GIP) manner. For example, as shown in FIG. 1, one gate driver GD may be formed in the second non-display area NDA2 and another gate driver GD may be formed in the third non-display area NDA3, but the present disclosure is not limited thereto. The gate driver GD may be formed in only one of the second non-display area NDA2 and the third non-display area NDA3.

Hereinafter, a pixel P of the transparent display apparatus 100 according to one embodiment of the present disclosure will be described with reference to FIGS. 2 and 5 to 8.

Referring to FIGS. 2 and 5 to 8, each of the plurality of pixels P provided in the display area DA may include a plurality of light emitting portions SP (or EA) and a transmissive portion TA1. In addition, each of the plurality of pixels P may further include a sub-transmissive portion STA. As shown in FIG. 2, the transmissive portion TA1 may be disposed to be adjacent to at least a portion of the plurality of light emitting portions SP. The sub-transmissive portion STA according to one example may be disposed between the transmissive portion TA1 and the red light emitting portion SP1. Referring to FIG. 8, each of the plurality of light emitting portions SP may include a buffer layer BL provided on the first substrate 110 to avoid moisture permeation to the thin film transistor 112.

In addition, each of the light emitting portions SP according to one embodiment of the present disclosure may include an inorganic layer 111 provided on an upper surface of the buffer layer BL, including a gate insulating layer 111a, an interlayer insulating layer 111b and a passivation layer 111c, a planarization layer 113 provided on the inorganic layer 111, a first electrode 114 provided on the planarization layer 113, a bank 115, an organic light emitting layer 116, a second electrode 117, and an encapsulation layer 118.

The thin film transistor 112 for driving the light emitting portion SP may be disposed in the inorganic layer 111. The inorganic layer 111 may be also referred to as a circuit element layer. The buffer layer BL may be included in the inorganic layer 111 together with the gate insulating layer 111a, the interlayer insulating layer 111b and the passivation layer 111c. The first electrode 114, the organic light emitting layer 116 and the second electrode 117 may be included in a light emitting element.

The buffer layer BL may be formed between the first substrate 110 and the gate insulating layer 111a to protect the thin film transistor 112. The buffer layer BL may be disposed entirely on one surface (or front surface) of the first substrate 110. The buffer layer BL may serve to prevent a material contained in the first substrate 110 from being diffused into a transistor layer during a high temperature process of the manufacturing process of the thin film transistor. Optionally, the buffer layer BL may be omitted as the case may be.

The thin film transistor (or a drive transistor) 112 according to an example may include an active layer 112a, a gate electrode 112b, a source electrode 112c, and a drain electrode 112d.

The active layer 112a may include a channel area, a drain area and a source area, which are formed in a thin film transistor area of a circuit area of the pixel P. The drain area and the source area may be spaced apart from each other with the channel area interposed therebetween.

The active layer 112a may be formed of a semiconductor material based on any one of amorphous silicon, polycrystalline silicon, oxide and organic material.

The gate insulating layer 111a may be formed on the channel area of the active layer 112a. As an example, the gate insulating layer 111a may be formed in an island shape only on the channel area of the active layer 112a, or may be formed on an entire front surface of the first substrate 110 or the buffer layer BL, which includes the active layer 112a.

The gate electrode 112b may be formed on the gate insulating layer 111a to overlap the channel area of the active layer 112a.

The interlayer insulating layer 111b may be formed on the gate electrode 112b and the drain area and the source area of the active layer 112a. The interlayer insulating layer 111b may be formed in the circuit area and an entire light emission area, in which light is emitted to the pixel P. For example, the interlayer insulating layer 111b may be made of an inorganic material, but is not necessarily limited thereto.

The source electrode 112c may be electrically connected to the source area of the active layer 112a through a source contact hole provided in the interlayer insulating layer 111b overlapped with the source area of the active layer 112a.

The drain electrode 112d may be electrically connected to the drain area of the active layer 112a through a drain contact hole provided in the interlayer insulating layer 111b overlapped with the drain area of the active layer 112a.

The drain electrode 112d and the source electrode 112c may be made of the same metal material. For example, each of the drain electrode 112d and the source electrode 112c may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Since each of the first and second switching thin film transistors is provided on the circuit area of the pixel P to have the same structure as that of the thin film transistor 112, its description will be omitted. The capacitor may be provided in an overlap area between the gate electrode 112b and the source electrode 112c of the thin film transistor 112, which overlap each other with the interlayer insulating layer 111b interposed therebetween.

Additionally, in order to prevent a threshold voltage of the thin film transistor provided in a pixel area from being shifted by light, the display panel or the first substrate 110 may further include a light shielding layer (shown in FIG. 8) provided below the active layer 112a of at least one of the thin film transistor 112, the first switching thin film transistor or the second switching thin film transistor. The light shielding layer may be disposed between the first substrate 110 and the active layer 112a to shield light incident on the active layer 112a through the first substrate 110, thereby minimizing a change in the threshold voltage of the transistor due to external light.

The protective layer 111c may be provided on the first substrate 110 to cover the pixel area. The protective layer 111c covers the drain electrode 112d and the source electrode 112c of the thin film transistor 112 and the interlayer insulating layer 111b. The protective layer 111c may be entirely formed in the circuit area and the light emission area. For example, the protective layer 111c may be expressed as a passivation layer. The protective layer 111c may be omitted.

The planarization layer 113 may be formed on the first substrate 110 to cover the protective layer 111c. When the protective layer 111c is omitted, the planarization layer 113 may be provided on the first substrate 110 to cover the circuit area. The planarization layer 113 may be formed entirely in the circuit area and the light emission area. In addition, the planarization layer 113 may be formed on the other area except the pad area PA in the non-display area NDA and the entire display area DA. For example, the planarization layer 113 may include an extension portion (or enlarged portion) extended or enlarged from the display area DA to the other non-display area NDA except the pad area PA. Therefore, the planarization layer 113 may have a size relatively wider than that of the display area DA.

The planarization layer 113 according to an example may be formed to be relatively thick, and thus may provide a flat surface on the display area DA and the non-display area NDA. For example, the planarization layer 113 may be made of an organic material such as photo acryl, benzocyclobutene, polyimide, and fluorine resin.

The first electrode 114 of the light emitting portion SP may be formed on the planarization layer 113. The first electrode 114 is connected to the drain electrode or the source electrode of the thin film transistor 112 through a contact hole passing through the planarization layer 113 and the passivation layer 111c. In the cross-sectional view of FIG. 8, the first electrode 114 is not connected to the drain electrode or the source electrode, but this is because that the thin film transistor 112 is not connected to the drain electrode or the source electrode at the cross-sectional position of FIG. 7. The first electrode 114 may be connected to a drain electrode or a source electrode of the thin film transistor 112 through the contact hole.

The first electrode 114 may be made of at least one of a transparent metal material, a semi-transmissive metal material, or a metal material having high reflectance.

When the transparent display apparatus 100 is provided in a top emission mode, the first electrode 114 may be formed of a metal material having high reflectance or a stacked structure of a metal material having high reflectance and a transparent metal material. For example, the first electrode 114 may be formed of a metal material having high reflectance, such as a stacked structure (Ti/Al/Ti) of aluminum and titanium, a stacked structure (ITO/Al/ITO) of aluminum and ITO, an Ag alloy, and a stacked structure (ITO/Ag alloy/ITO) of Ag alloy and ITO. The Ag alloy may be an alloy such as silver (Ag), palladium (Pd), and copper (Cu).

When the transparent display apparatus 100 is provided in a bottom emission mode, the first electrode 114 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

Meanwhile, the material constituting the first electrode 114 may include MoTi. The first electrode 114 may be an anode electrode or a pixel electrode.

The bank 115 is a non-light emission area in which light is not emitted, and may be provided to surround each of light emission areas (or light emitting portions) of each of the plurality of light emitting portions SP. The bank 115 may partition (or define) the respective light emission areas (or light emitting portions).

The bank 115 may be formed on the planarization layer 113 to cover an edge of the first electrode 114, thereby partitioning (or defining) the light emission areas (or light emitting portions) of the plurality of light emitting portions SP.

The bank 115 may be formed to cover the edge of the first electrode 114 of each of the light emitting portions SP and expose a portion of each of the first electrodes 114. Therefore, a current is concentrated on an end of each of the first electrodes 114 to avoid a problem in which light emitting efficiency is degraded. An exposed portion of the first electrode 114 that is not covered by the bank 115 may be a light emission area (or light emitting portion).

The bank 115 may be formed of an organic layer such as an acrylic resin, an epoxy resin, a phenolic resin, a polyamide resin, and a polyimide resin, but is not limited thereto.

The organic light emitting layer 116 is formed on the first electrode 114 and the bank 115. When a voltage is applied to the first electrode 114 and the second electrode 117, holes and electrons move to the organic light emitting layer 116, respectively, and are combined with each other in the organic light emitting layer 116 to emit light.

The organic light emitting layer 116 may be formed of a common layer provided on the plurality of light emitting portions SP and the bank 115. In this case, the organic light emitting layer 116 may be provided in a tandem structure in which a plurality of light emitting layers, for example, a yellow-green light emitting layer and a blue light emitting layer are stacked, and may emit white light when an electric field is formed between the first electrode 114 and the second electrode 117.

A color filter (not shown) suitable for a color of a corresponding light emitting portions SP may be formed on the second substrate 120. For example, a red color filter may be provided in a red subpixel, a green color filter may be provided in a green subpixel, and a blue color filter may be provided in a blue subpixel. A white subpixel may not include a color filter because the organic light emitting layer 116 emits white light.

The second electrode 117 is formed on the organic light emitting layer 116. The second electrode 117 may be a common layer commonly formed in the light emitting portions SP. The second electrode 117 may be made of a transparent metal material, a semi-transmissive metal material or a metal material having high reflectance.

When the transparent display apparatus 100 is provided in a top emission mode, the second electrode 117 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

When the transparent display apparatus 100 is provided in a bottom emission mode, the second electrode 117 may be formed of a metal material having high reflectance, such as a stacked structure (Ti/Al/Ti) of aluminum and titanium, a stacked structure (ITO/Al/ITO) of aluminum and ITO, an Ag alloy and a stacked structure (ITO/Ag alloy/ITO) of Ag alloy and ITO. The Ag alloy may be an alloy of silver (Ag), palladium (Pd), copper (Cu), etc. The second electrode 117 may be a cathode electrode or an opposite electrode.

The encapsulation layer 118 is formed on the second electrode 117. The encapsulation layer 118 serves to prevent oxygen or water from being permeated into the organic light emitting layer 116 and the second electrode 117. To this end, the encapsulation layer 118 may include at least one inorganic layer.

In the transparent display apparatus 100 according to one embodiment of the present disclosure, the encapsulation layer 118 may be disposed not only in the display area DA but also in the non-display area NDA. The encapsulation layer 118 according to one example may be disposed between the second electrode 117 and a second substrate 120.

Referring back to FIG. 8, a color filter 119 and a black matrix BM may be disposed between the encapsulation layer 118 and the second substrate 120. As described herein, since the organic light emitting layer 116 emits white light, the white light emitting portion SP4 may not include a color filter. In contrast, a red color filter may be provided between the encapsulation layer 118 and the second substrate 120 in the red light emitting portion SP1.

As shown in FIG. 8, the black matrix BM may be provided between the red light emitting portion SP1 and the transmissive portion TA1 and between the red light emitting portion SP1 and the sub-transmissive portion STA to prevent a color mixture and/or light leakage from occurring. The black matrix BM may be made of a black-based material, and may be disposed to overlap the bank 115. An area in which the black matrix BM and/or the bank 115 is provided may be a dead zone or a non-light emission area. The black matrix BM according to one example may be formed on the second substrate 120 to at least partially overlap the bank 115, so that a cell gap between the organic light emitting layer 116 and the second substrate 120 may be reduced to prevent a color mixture from occurring between the light emitting portions SP.

The first substrate 110 provided with the encapsulation layer 118 and the second substrate 120 provided with the color filter 119 may be bonded to each other by a separate adhesive layer AL. The adhesive layer AL may be an optically clear resin layer (OCR) or an optically clear adhesive film (OCA).

Hereinafter, a sub electrode SE of the transparent display apparatus 100 according to one embodiment of the present disclosure will be described in detail with reference to FIGS. 9 and 10.

Figure 9:
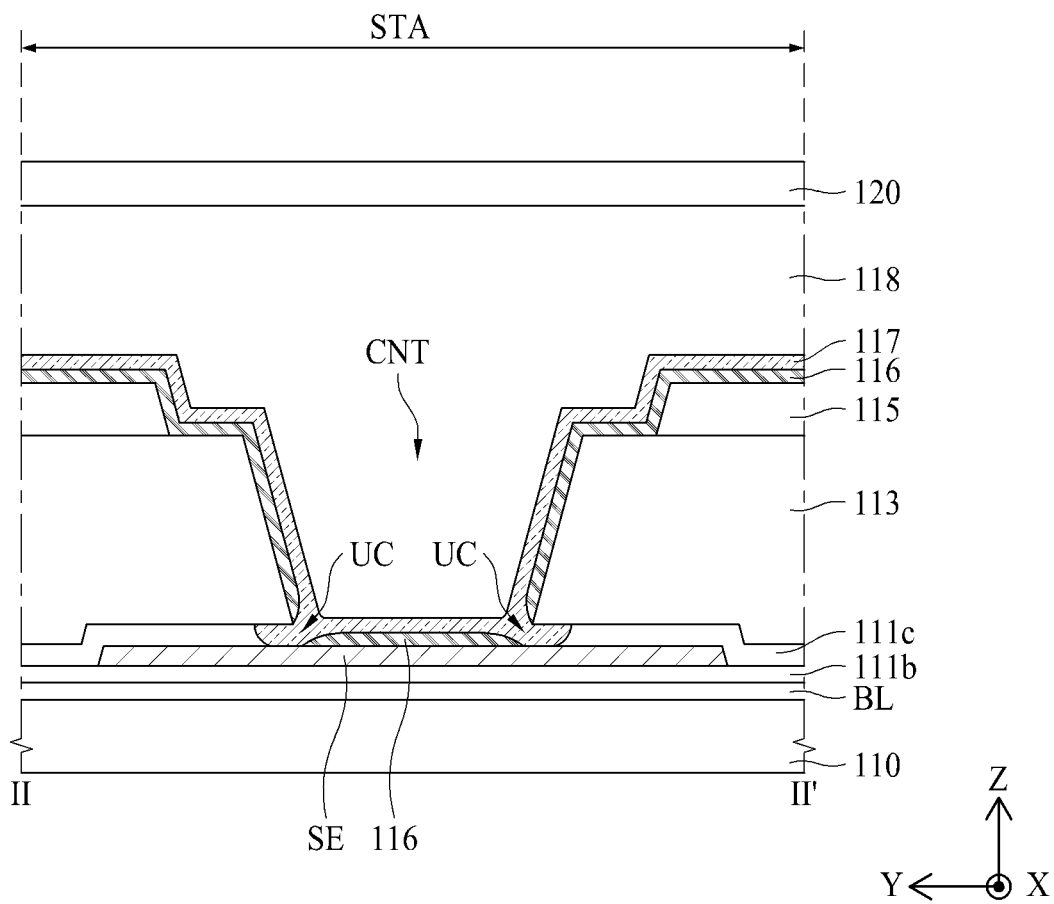
FIG. 9 is a cross-sectional view taken along line II-II' shown in FIG. 7.
Figure 10:
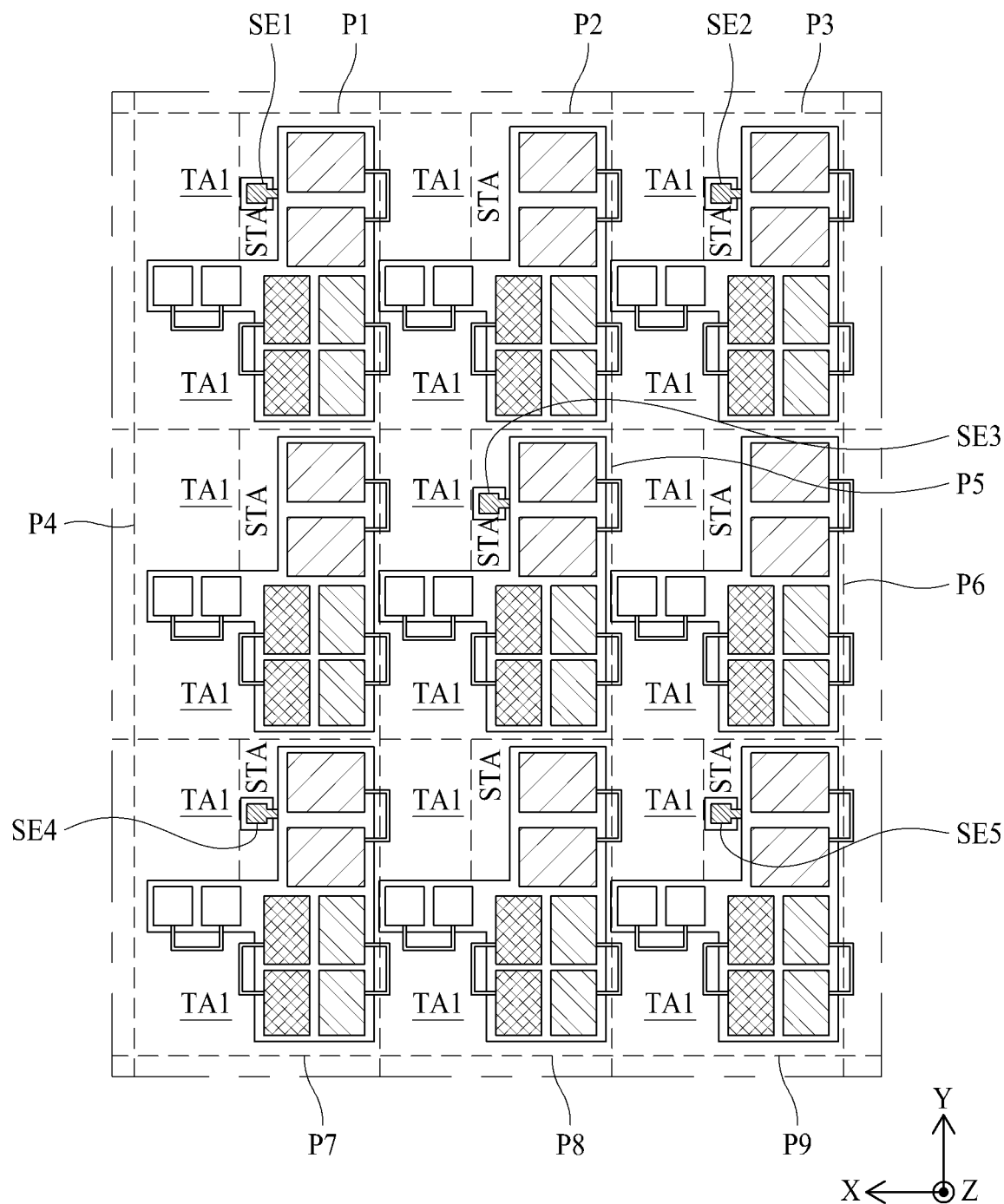
FIG. 10 is a plan view illustrating an example in which a sub electrode contact portion is disposed in a zigzag pattern.

FIG. 9 is a cross-sectional view taken along line II-IF shown in FIG. 7, and FIG. 10 is a plan view illustrating an example in which a sub electrode contact portion is disposed in a zigzag pattern.

Referring to FIGS. 7 to 10, the transparent display apparatus 100 according to one embodiment of the present disclosure may further include a sub electrode SE.

The sub electrode SE is used to apply a common voltage to a pixel P that is disposed at an edge and/or a center of the display area DA. When the transparent display apparatus 100 is provided to have a large area, a voltage drop of a common voltage applied from the edge portion of the display area DA may occur toward the center portion of the display area DA due to resistance of an internal line or a plurality of pixels P. For this reason, non-uniform luminance may occur between the edge portion and the center portion of the display area DA. In the transparent display apparatus 100 according to one embodiment of the present disclosure, since the sub electrode SE is provided, such non-uniform luminance may not occur. The sub electrode SE according to one example may be provided in each of the plurality of pixels P provided in the display area DA. For example, as shown in FIG. 7, the sub electrode SE may be disposed in the sub-transmissive portion STA. The sub electrode SE may be disposed in the sub-transmissive portion STA and connected to the common power line VSSL. The sub electrode SE may be in contact with the second electrode (or opposite electrode) 117 through a sub electrode contact portion CNT provided in the sub-transmissive portion STA. Therefore, since the sub electrode SE may apply a common power source applied through the common power line VSSL to the second electrode 117 of each pixel P, non-uniform luminance in the display area DA may be avoided.

Hereinafter, the sub electrode contact portion CNT will be described in detail with reference to FIG. 9. The sub electrode contact portion CNT may be provided in the sub-transmissive portion STA. Since the sub electrode contact portion CNT is provided in the sub-transmissive portion STA, transmittance of the transmissive portion TA1 may be improved as compared with the case that the sub electrode contact portion CNT is disposed in the transmissive portion TA1.

The sub electrode contact portion CNT according to one example may include a buffer layer BL, an interlayer insulating layer 111b, a passivation layer 111c, a planarization layer 113, and a bank 115. A portion of the bank 115, the planarization layer 113 and the passivation layer 111c, which are provided in the sub electrode contact portion CNT, may be patterned by a photo process and an etching process. In this case, an undercut portion UC may be formed below the planarization layer 113 by using an etching material for etching an inorganic material so that the passivation layer 111c made of an inorganic material is more etched than the planarization layer 113 made of an organic material. As shown in FIG. 9, an upper surface of the sub electrode SE may be exposed in an area surrounded by the undercut portions UC, e.g., in the sub electrode contact portion CNT. The organic light emitting layer 116 formed in a subsequent process may be disconnected due to the undercut portion UC, whereby the sub electrode SE may be partially exposed from the undercut portion UC without being fully covered by the organic light emitting layer 116. Therefore, the second electrode 117 formed in next process may be in contact with the upper surface of the sub electrode SE exposed from the undercut portion UC. Since the second electrode 117 is a common layer formed in the entire display area DA, the second electrode 117 may apply a common power source (or a common voltage) to the pixel P adjacent to the sub electrode contact portion CNT. Therefore, in the transparent display apparatus 100 according to one embodiment of the present disclosure, since the second electrode 117 is electrically connected to the sub electrode SE in the sub-transmissive portion STA, non-uniform luminance may be avoided between the pixel P disposed at the edge portion of the display area DA and the pixel P disposed at the center portion of the display area DA.

Referring to FIG. 10, in the transparent display apparatus 100 according to one embodiment of the present disclosure, the sub electrode SE may be alternately disposed in the plurality of pixels P disposed in the first direction (Y-axis direction) and/or the second direction (X-axis direction). In some embodiments, one sub electrode SE may be disposed every two pixels P that are disposed to be adjacent to each other, and thus may be connected to the common power line VSSL. For example, the sub electrode SE may be provided in the first pixel P1, the third pixel P3, the fifth pixel P5, the seventh pixel P7 and the ninth pixel P9 of nine pixels P1, P2, P3, P4, P5, P6, P7, P8 and P9. The sub electrode SE may be disposed in the odd-numbered pixels P among the nine pixels P1, P2, P3, P4, P5, P6, P7, P8 and P9. For example, a first sub electrode SE1 may be provided in the first pixel P1, a second sub electrode SE2 may be provided in the third pixel P3, a third sub electrode SE3 may be provided in the fifth pixel P5, a fourth sub electrode SE4 may be provided in the seventh pixel P7, and a fifth sub electrode SE5 may be provided in the ninth pixel P9, but the present disclosure is not limited thereto. The sub electrode SE may be disposed in the even-numbered pixels P among the nine pixels P1, P2, P3, P4, P5, P6, P7, P8 and P9.

When the sub electrode SE is provided for each of the plurality of pixels P, since the sub electrode SE covers a predetermined area of the sub-transmissive portion STA, transmittance may be reduced as compared with the case that the sub electrode SE is alternately disposed in the plurality of pixels P. Therefore, in the transparent display apparatus 100 according to one embodiment of the present disclosure, as shown in FIG. 10, transmittance of the sub-transmissive portion STA may be improved as compared with the case that the sub electrode SE (or the sub electrode contact portion CNT) is disposed in each of the plurality of pixels P.

As the sub electrode SE (or the sub electrode contact portion CNT) is alternately disposed in the plurality of pixels P, as shown in FIG. 10, the sub electrode SE may be disposed in the plurality of pixels P in a zigzag pattern in the first direction (Y-axis direction) and/or the second direction (X-axis direction). For example, the first sub electrode SE1 disposed in the first pixel P1, the third sub electrode SE3 disposed in the fifth pixel P5 and the fourth sub electrode SE4 disposed in the seventh pixel P7 may be provided in the form of '>' in the first direction (Y-axis direction). In addition, the first sub electrode SE1 disposed in the first pixel P1, the third sub electrode SE3 disposed in the fifth pixel P5 and the second sub electrode SE2 disposed in the third pixel P3 may be provided in the form of 'y' in the second direction (X-axis direction).

Therefore, in the transparent display apparatus 100 according to one embodiment of the present disclosure, the sub electrode SE (or the sub electrode contact portion CNT) is disposed in a zigzag pattern, so that the sub electrode SE (or the sub electrode contact portion CNT) may be prevented from being seen in a row (or regularly) to a user as like the case that the sub electrode SE (or the sub electrode contact portion CNT) is disposed in each of the plurality of pixels P, whereby visibility (or readability) of the background and/or the image through the sub-transmissive portion STA may be improved.

According to the present disclosure, the following advantageous effects may be obtained.

The transparent display apparatus according to the present disclosure may include a non-transmissive portion provided between the transmissive portion and the plurality of light emitting portions and between the plurality of light emitting portions in the display area. In the present disclosure, since the first non-transmissive portion and the second non-transmissive portion of the non-transmissive portion are provided to satisfy the equation such as A:2B=(a+b):(c+d+e), the size of the non-light emission area (or the non-transmissive portion) may be reduced, whereby light efficiency and/or transmittance may be improved.

Also, in the present disclosure, the plurality of light emitting portions and the transmissive portions are disposed so that the size of the non-light emission area (or the non-transmissive portion) is reduced, whereby the transmissive portion (or the sub-transmissive portion) may be further provided in each pixel to improve transmittance.

Also, in the present disclosure, since the size of the red light emitting portion is larger than that of the other colored light emitting portion, the user's perception for luminance deterioration of the blue light may be relatively lowered, whereby the sense of difference of the image due to luminance deterioration of the blue light may be eliminated.

Also, in the present disclosure, since the size of the red light emitting portion is larger than that of the other colored light emitting portion, the red light emission area may be driven even with a low voltage, whereby the lifetime of the red light emitting portion having a relatively short lifetime may be increased as compared with the other colored light emitting portion.

Also, in the present disclosure, since the size of the colored light emitting portion including the red light emitting portion may be larger than that of the general OLED, luminance of the image may be improved so that visibility of the image may be improved even though the rear background is seen to the user through the transmissive portion.

Also, in the present disclosure, since the sub electrode for preventing the common voltage drop from occurring may be provided in the sub-transmissive portion, transmittance of the transmissive portion may be further improved.

Also, in the present disclosure, since the sub electrode contact portion provided with the sub electrode is disposed per two pixels, transmittance may be improved as compared with the case that the sub electrode contact portion is disposed for each pixel.

Also, in the present disclosure, since the plurality of sub electrode contact portions are disposed in a zigzag pattern, visibility of the background and/or the image may be improved as compared with the case that the plurality of sub electrode contact portions are disposed in a row.

It will be apparent to those skilled in the art that the present disclosure described herein is not limited by the above-described embodiments and the accompanying drawings and that various substitutions, modifications and variations can be made in the present disclosure without departing from the spirit or scope of the disclosures. It is intended that all variations or modifications derived from the meaning, scope and equivalent concept of the embodiments described herein fall within the scope of the present disclosure.

The various embodiments described herein can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display apparatus comprising:
   a substrate provided with a plurality of pixels each having a transmissive portion and a plurality of light emitting portions emitting light of different colors; and a non-transmissive portion provided between the transmissive portion and the plurality of light emitting portions and between the plurality of light emitting portions on the substrate, wherein:
each of the plurality of light emitting portions includes a first sub-light emitting portion and a second sub-light emitting portion, the first sub-light emitting portion and second sub-light emitting portion having a same shape and a same size and are spaced apart from each other, the non-transmissive portion includes a first non-transmissive portion adjacent to a short side of each of the first sub-light emitting portion and the second sub-light emitting portion and a second non-transmissive portion adjacent to a long side of each of the first sub-light emitting portion and the second sub-light emitting portion, the short side disposed in a first direction, the long side disposed in a second direction crossing the first direction, the short sides of the first sub-light emitting portion and the second sub-light emitting portion include a first short side connected to one end of the long side and a second short side connected to another end of the long side, the long side of the first sub-light emitting portion includes a first long side connecting one end of the first short side of the first sub-light emitting portion with one end of the second short side of the first sub-light emitting portion and a second long side connecting another end of the first short side of the first sub-light emitting portion with another end of the second short side of the first sub-light emitting portion, the long side of the second sub-light emitting portion includes a first long side connecting one end of the first short side of the second sub-light emitting portion with one end of the second short side of the second sub-light emitting portion and a second long side connecting another end of the first short side of the second sub-light emitting portion and another end of the second short side of the second sub-light emitting portion, the first non-transmissive portion and the second non-transmissive portion are provided to satisfy A:2B= (a+b):(c+d+e), where 'A' is a length of the long side of the first sub-light emitting portion, 'B' is a length of the short side of the first sub-light emitting portion, 'a' is a length of the first non-transmissive portion in the second direction, which is adjacent to the first short side of the first sub-light emitting portion, 'b' is a length of the first non-transmissive portion in the second direction, which is adjacent to the second short side of the first sub-light emitting portion, 'c' is a length of the second non-transmissive portion in the first direction, which is adjacent to the first long side of the first sub-light emitting portion, 'd' is a length of the second non-transmissive portion in the first direction, which is adjacent to the second long side of the first sub-light emitting portion or the first long side of the second sub-light emitting portion, and e' is a length of the second non-transmissive portion in the first direction, which is adjacent to the second long side of the second sub-light emitting portion.

2. The transparent display apparatus of claim 1, wherein the plurality of light emitting portions include a first light emitting portion, a second light emitting portion, a third light emitting portion and a fourth light emitting portion, and the first light emitting portion includes an area larger than that of each of the second light emitting portion, the third light emitting portion and the fourth light emitting portion.

3. The transparent display apparatus of claim 2, wherein the first light emitting portion is a red light emitting portion configured to emit red light.

4. The transparent display apparatus of claim 1, wherein the non-transmissive portion includes:
a shared non-transmissive portion disposed between the plurality of light emitting portions; and
a non-shared non-transmissive portion disposed between the plurality of light emitting portions and the transmissive portion,
wherein each of the first non-transmissive portion and the second non-transmissive portion is the shared non-transmissive portion or the non-shared non-transmissive portion, and
wherein a width of the shared non-transmissive portion is greater than that of the non-shared non-transmissive portion.

5. The transparent display apparatus of claim 4, wherein the plurality of light emitting portions include a white light emitting portion and a plurality of colored light emitting portions,
the non-shared non-transmissive portion includes a first non-shared non-transmissive portion disposed between the white light emitting portion and the transmissive portion, and a second non-shared non-transmissive portion disposed between each of a plurality of the colored light emitting portion and the transmissive portion,
a width of the second non-shared non-transmissive portion is greater than that of the first non-shared non-transmissive portion.

6. The transparent display apparatus of claim 5, wherein the shared non-transmissive portion includes:
a first shared non-transmissive portion disposed between the plurality of colored light emitting portions; and
a second shared non-transmissive portion disposed between one of the plurality of colored light emitting portions and the white light emitting portion, and
a width of the first shared non-transmissive portion is equal to that of the second shared non-transmissive portion.

7. The transparent display apparatus of claim 6, wherein the colored light emitting portion includes a red light emitting portion, a green light emitting portion and a blue light emitting portion,
at least a portion of the red light emitting portion overlaps each of the green light emitting portion and the blue light emitting portion in the first direction, and
the white light emitting portion is adjacent to the green light emitting portion in the second direction and is adjacent to the transmissive portion in the first direction.

8. The transparent display apparatus of claim 5, wherein the colored light emitting portion includes a red light emitting portion, a green light emitting portion and a blue light emitting portion, and
a width of the red light emitting portion in the second direction is equal to or smaller than a sum width of a width of the green light emitting portion and a width of the blue light emitting portion in the second direction.

9. The transparent display apparatus of claim 7, further comprising a sub-transmissive portion provided between the red light emitting portion and the transmissive portion.

10. The transparent display apparatus of claim 7, wherein a width of the second non-shared non-transmissive portion disposed between the red light emitting portion and the transmissive portion is smaller than that of the first shared non-transmissive portion disposed between the green light emitting portion and the blue light emitting portion.

11. The transparent display apparatus of claim 9, further comprising:
- a common power line that overlaps the red light emitting portion in the first direction; and
- a sub electrode connected to the common power line and disposed in the sub-transmissive portion.

12. The transparent display apparatus of claim 11, wherein each of the plurality of light emitting portions includes:
- a pixel electrode disposed on the substrate;
- an organic light emitting layer disposed on the pixel electrode; and
- an opposite electrode disposed on the organic light emitting layer, and
- the opposite electrode electrically connected to the sub electrode in the sub-transmissive portion.

13. The transparent display apparatus of claim 11, wherein the sub electrode is alternately disposed in a plurality of pixels disposed in one or more of the first direction or the second direction.

14. The transparent display apparatus of claim 13, wherein the sub electrode is in a zigzag pattern in the one or more of first direction or the second direction.

15. The transparent display apparatus of claim 1, wherein the plurality of light emitting portions include a white light emitting portion and a colored light emitting portion, which are adjacent to the transmissive portion,
- each of the white light emitting portion and the colored light emitting portion includes the first sub light emitting portion and the second sub light emitting portion, and
- the first sub-light emitting portion and the second sub-light emitting portion are connected to each other through a repair line.

16. The transparent display apparatus of claim 15, wherein the transmissive portion is adjacent to each of the white light emitting portion and the colored light emitting portion at different positions, and
- the repair line is disposed at least partially in the transmissive portion.

17. A transparent display apparatus comprising:
- a substrate provided with a plurality of pixels each having a transmissive portion and a plurality of light emitting portions; and
- a non-transmissive portion provided between the transmissive portion and the plurality of light emitting portions and between the plurality of light emitting portions on the substrate,
- wherein each of the light emitting portions includes a plurality of first light emitting sides disposed in parallel and a plurality of second light emitting sides respectively connected to the first light emitting sides,
- the non-transmissive portion includes a plurality of first non-transmissive portions respectively adjacent to the first light emitting sides and a plurality of second non-transmissive portions respectively adjacent to the second light emitting sides, and
- a ratio of a sum length of the first light emitting sides to a length of each of the second light emitting sides is equal to a ratio of a sum length of the second non-transmissive portions to a sum length of the first non-transmissive portions.

18. The transparent display apparatus of claim 17, wherein the plurality of light emitting portions include a first light emitting portion, a second light emitting portion, a third light emitting portion and a fourth light emitting portion,
- the first light emitting portion is provided to have an area larger than that of each of the second light emitting portion, the third light emitting portion and the fourth light emitting portion, and
- the first light emitting portion is a red light emitting portion configured to emit red light.

19. The transparent display apparatus of claim 18, wherein the non-transmissive portion includes:
- a shared non-transmissive portion disposed between the plurality of light emitting portions; and
- a non-shared non-transmissive portion disposed between the plurality of light emitting portions and the transmissive portion,
- each of the first non-transmissive portion and the second non-transmissive portion is the shared non-transmissive portion or the non-shared non-transmissive portion, and
- a width of the shared non-transmissive portion is greater than that of the non-shared non-transmissive portion.

20. The transparent display apparatus of claim 19, wherein the plurality of light emitting portions include a white light emitting portion and a colored light emitting portion,
- the non-shared non-transmissive portion includes a first non-shared non-transmissive portion disposed between the white light emitting portion and the transmissive portion, and a second non-shared non-transmissive portion disposed between the colored light emitting portion and the transmissive portion, and
- a width of the second non-shared non-transmissive portion is greater than that of the first non-shared non-transmissive portion.

21. The transparent display apparatus of claim 19, wherein the plurality of light emitting portions include a white light emitting portion and a plurality of colored light emitting portions,
- the shared non-transmissive portion includes a first shared non-transmissive portion disposed between the plurality of colored light emitting portions, and a second shared non-transmissive portion disposed between the colored light emitting portion and the white light emitting portion, and
- a width of the first shared non-transmissive portion is equal to that of the second shared non-transmissive portion.

22. The transparent display apparatus of claim 20, wherein the colored light emitting portion includes a red light emitting portion, a green light emitting portion and a blue light emitting portion,
- at least a portion of the red light emitting portion overlaps each of the green light emitting portion and the blue light emitting portion in a first direction, and
- the white light emitting portion is adjacent to the green light emitting portion in a second direction and is adjacent to the transmissive portion in the first direction.

23. The transparent display apparatus of claim 20, wherein the colored light emitting portion includes a red light emitting portion, a green light emitting portion and a blue light emitting portion, and
- a width of the red light emitting portion is equal to or smaller than a sum of a width of the green light emitting portion and a width of the blue light emitting portion.

24. The transparent display apparatus of claim 23, further comprising:
- a sub-transmissive portion provided between the transmissive portion and the red light emitting portion;
- a common power line disposed in the first direction to overlap the red light emitting portion; and
- a sub electrode connected to the common power line and disposed in the sub-transmissive portion.

25. A transparent display apparatus comprising:
- a plurality of pixels each having a transmissive portion and a plurality of light emitting portions; and
- a non-transmissive portion between the transmissive portion and the plurality of light emitting portions and between the plurality of light emitting portions,
- wherein the plurality of light emitting portions includes a red light emitting portion, a blue light emitting portion, a green light emitting portion and a white light emitting portion, the red light emitting portion having an area greater than an area of each of the blue light emitting portion, the green light emitting portion and the white light emitting portion.

26. The transparent display apparatus of claim 25, wherein:
- the red light emitting portion is adjacent to both the green light emitting portion and the blue light emitting portion in a first direction,
- the green light emitting portion and the blue light emitting portion are adjacent to each other in a second direction that crosses the first direction, and
- the white light emitting portion is adjacent to one of the green light emitting portion or the green light emitting portion in the second direction.

27. The transparent display apparatus of claim 26, wherein a dimension of the red light emitting portion in the second direction is greater than a dimension of each of the green light emitting portion or the blue light emitting portion in the second direction.

28. The transparent display apparatus of claim 26, wherein a dimension of the red light emitting portion in the second direction is equal to a sum of a dimension of the green light emitting portion and a dimension of the blue light emitting portion in the second direction.

29. The transparent display apparatus of claim 26, wherein:
- the red light emitting portion, the green light emitting portion, and the blue light emitting portion each includes two sub portions separated by the non-transmission portion and positioned with respect to each other in the first direction; and
- the white light emitting portion includes two sub portions separated by the non-transmission portion and positioned with respect to each other in the second direction.

30. The transparent display apparatus of claim 29, comprising a plurality of repair lines, the two sub portions of each of the red light emitting portion, the green light emitting portion, the blue light emitting portion, and the white light emitting portion being connected to each other by a repair line of the plurality of repair lines.

* * * * *